US008244502B2

(12) United States Patent
Hamann et al.

(10) Patent No.: US 8,244,502 B2
(45) Date of Patent: Aug. 14, 2012

(54) KNOWLEDGE-BASED MODELS FOR DATA CENTERS

(75) Inventors: Hendrik F. Hamann, Yorktown Heights, NY (US); Raymond Lloyd, Dublin (IE); Wanli Min, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 429 days.

(21) Appl. No.: 12/540,213

(22) Filed: Aug. 12, 2009

(65) Prior Publication Data

US 2011/0040532 A1    Feb. 17, 2011

(51) Int. Cl.
    *G06F 17/50* (2006.01)
(52) U.S. Cl. .......................................................... 703/1
(58) Field of Classification Search .................. 703/1, 2, 703/6; 702/128, 188; 705/8; 700/63; 361/687, 361/690; 342/357.62; 369/44.25; 422/82.05; 356/601; 428/195.1
    See application file for complete search history.

(56) References Cited

U.S. PATENT DOCUMENTS

| | | | | | |
|---|---|---|---|---|---|
| 5,482,760 | A | * | 1/1996 | Takeuchi | 428/195.1 |
| 5,539,521 | A | * | 7/1996 | Otokake et al. | 356/601 |
| 5,654,718 | A | * | 8/1997 | Beason et al. | 342/357.62 |
| 6,373,033 | B1 | | 4/2002 | De Waard et al. | |
| 7,366,632 | B2 | | 4/2008 | Hamann et al. | |
| 2003/0133840 | A1 | * | 7/2003 | Coombs et al. | 422/82.05 |
| 2004/0218355 | A1 | * | 11/2004 | Bash et al. | 361/690 |
| 2006/0161397 | A1 | | 7/2006 | Hayzen et al. | |
| 2006/0229745 | A1 | * | 10/2006 | Ueda et al. | 700/63 |
| 2007/0067435 | A1 | | 3/2007 | Landis et al. | |
| 2007/0078635 | A1 | * | 4/2007 | Rasmussen et al. | 703/1 |
| 2007/0098037 | A1 | | 5/2007 | Hamann et al. | |
| 2007/0174018 | A1 | * | 7/2007 | Tada et al. | 702/128 |
| 2007/0206452 | A1 | * | 9/2007 | Kim | 369/44.25 |
| 2008/0174954 | A1 | * | 7/2008 | VanGilder et al. | 361/687 |
| 2008/0288220 | A1 | | 11/2008 | Dillenberger et al. | |
| 2008/0307176 | A1 | | 12/2008 | Ohno et al. | |
| 2009/0138313 | A1 | * | 5/2009 | Morgan et al. | 705/8 |
| 2009/0150123 | A1 | | 6/2009 | Archibald et al. | |
| 2010/0280796 | A1 | * | 11/2010 | Ramin et al. | 702/188 |

OTHER PUBLICATIONS

Nakatani et al., "Empirical observations on object evolution", IEEE 1999.*
Hamann, Hendrik F., "A Measurement-Based Method for Improving Data Center Energy Efficiency.," IEEE International Conference on Sensor Networks, Ubiquitous, and Trustworthy Computing, Jun. 11-13, 2008.

(Continued)

*Primary Examiner* — Kandasamy Thangavelu
(74) *Attorney, Agent, or Firm* — Vazken Alexanian; Michael J. Chang, LLC

(57) ABSTRACT

Techniques for data center analysis are provided. In one aspect, a method for modeling thermal distributions in a data center is provided. The method includes the following steps. Vertical temperature distribution data is obtained for a plurality of locations throughout the data center. The vertical temperature distribution data for each of the locations is plotted as an s-curve, wherein the vertical temperature distribution data reflects physical conditions at each of the locations which is reflected in a shape of the s-curve. Each of the s-curves is represented with a set of parameters that characterize the shape of the s-curve, wherein the s-curve representations make up a knowledge base model of predefined s-curve types from which thermal distributions and associated physical conditions at the plurality of locations throughout the data center can be analyzed.

17 Claims, 15 Drawing Sheets

OTHER PUBLICATIONS

Noel A.C. Cressie "Statistics for Spatial Data," Chapter 3, A Wiley-Interscience publication, (1991).

Hamann et al., "Uncovering Energy-Efficiency Opportunities in Data Centers," IBM Journal of Research and Development, vol. 53, No. 3 (2009).

P. Scheihing, "Creating Energy-Efficient Data Centers," Data Center Facilities and Engineering Conference, Washington, DC (May 18, 2007).

2008 ASHRAE Environmental Guidelines for Datacom Equipment, Expanding the Recommended Environmental Envelope.

* cited by examiner

100

300A

300B

500

400

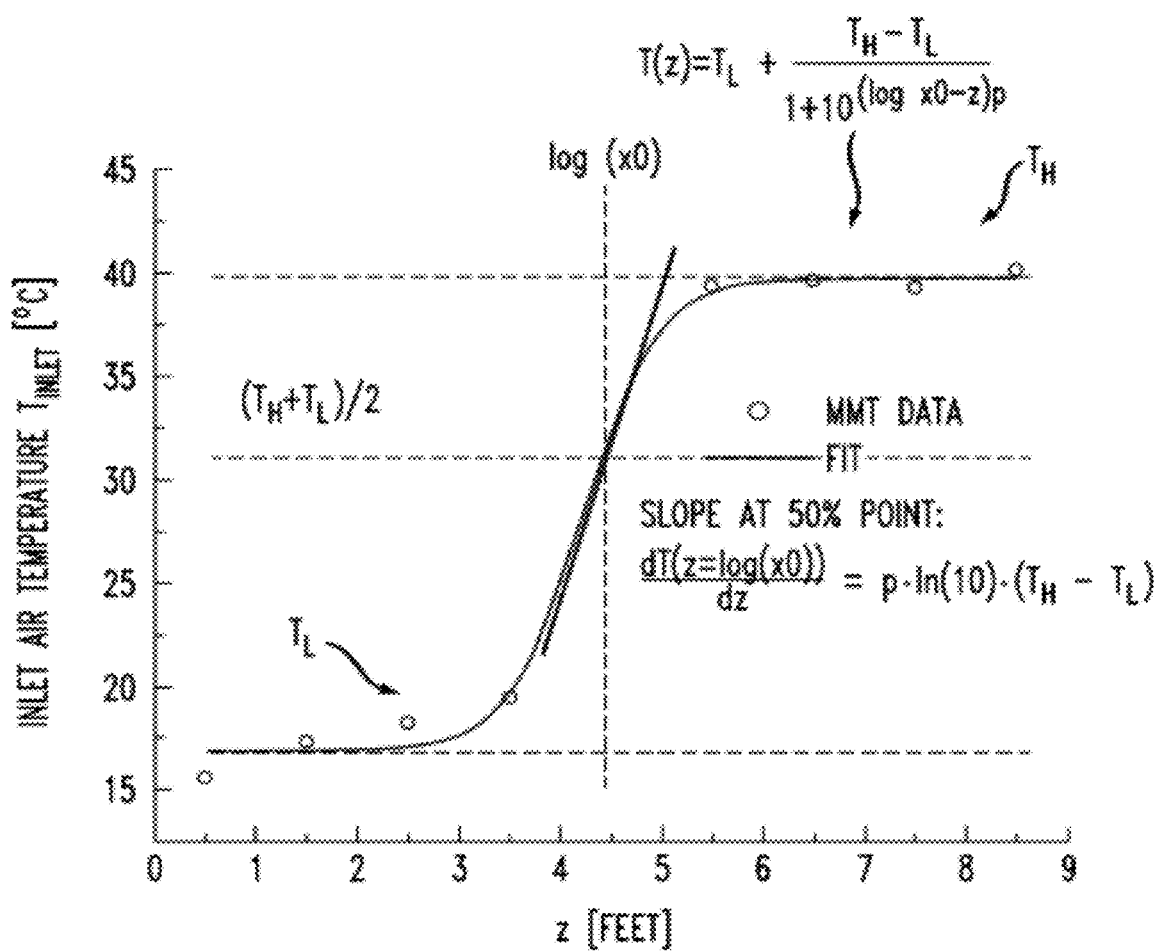

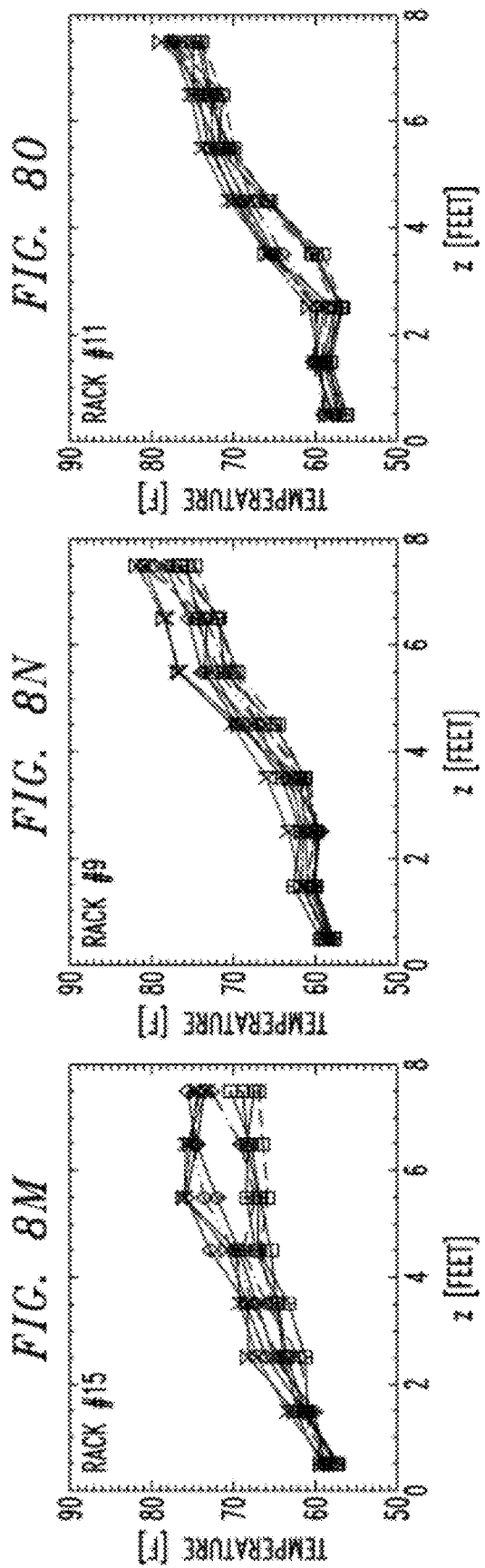
FIG. 8O
FIG. 8N
FIG. 8M
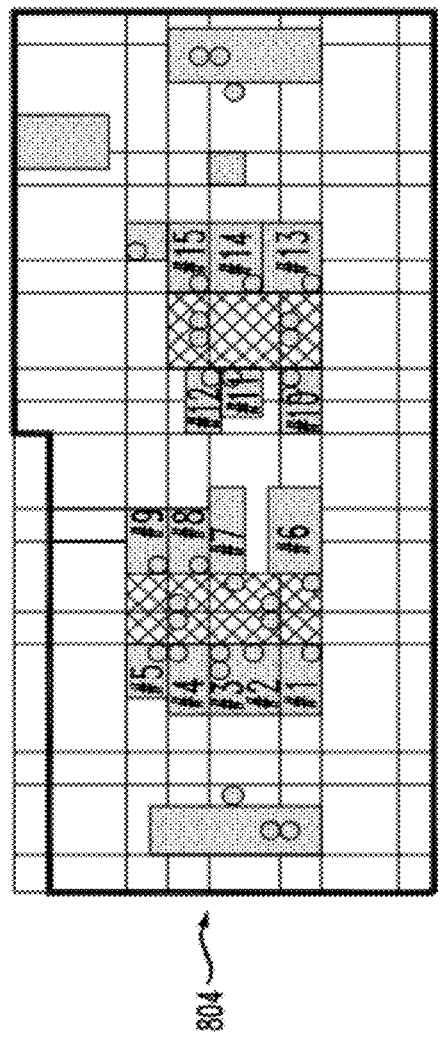
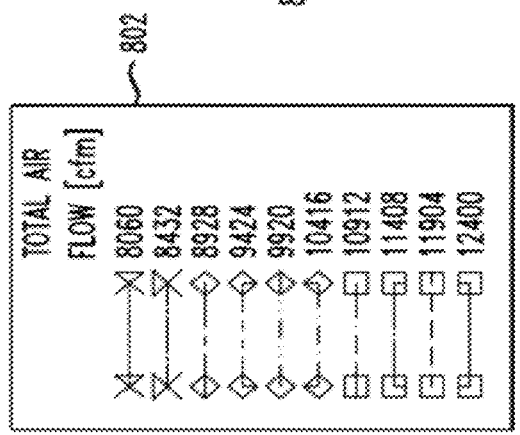

900

"KNOWLEDGE-BASED" MODELING - FITTING RESULTS

| RACK # | T LOW [C] | T HIGH [C] | log(x0) IN FEET - 50% HEIGHT | p | SLOPE AT 50% [C/FEET] |
|---|---|---|---|---|---|
| 1 | 19.05079 | 40.44292 | 3.72791 | 0.38163 | 18.7980251 |
| 2 | 17.76896 | 39.87857 | 4.80828 | 1.03209 | 52.5429365 |
| 3 | 16.98843 | 39.80586 | 4.23669 | 1.19991 | 63.0421605 |
| 4 | 16.35103 | 38.67194 | 4.22731 | 1.20862 | 62.1179853 |
| 5 | 17.10571 | 39.12415 | 4.6642 | 1.03362 | 52.40384325 |
| 6 | 21.70818 | 38.54288 | 4.93851 | 1.24034 | 48.07970782 |
| 7 | 22.07445 | 40.45116 | 3.08249 | 0.40497 | 17.13587568 |
| 8 | 17.93882 | 40.51833 | 4.26789 | 0.55826 | 29.02463139 |
| 9 | 15.60893 | 39.99833 | 3.82129 | 0.44578 | 25.0344114 |
| 10 | 16.88 | 38.94916 | 4.11665 | 0.83516 | 42.4395898 |
| 11 | 19.83215 | 38.88919 | 4.43702 | 0.62334 | 27.35244358 |
| 12 | 18.18105 | 37.64882 | 2.85794 | 0.4246 | 19.03320324 |

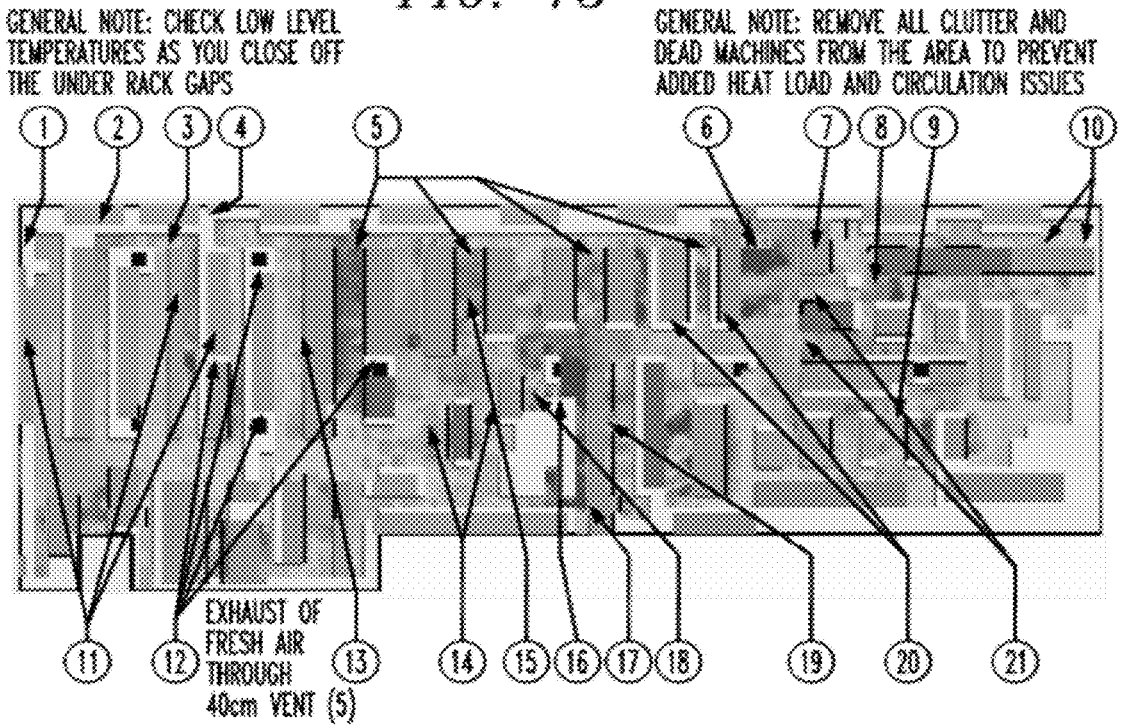

GENERAL NOTE: CHECK LOW LEVEL TEMPERATURES AS YOU CLOSE OFF THE UNDER RACK GAPS

GENERAL NOTE: REMOVE ALL CLUTTER AND DEAD MACHINES FROM THE AREA TO PREVENT ADDED HEAT LOAD AND CIRCULATION ISSUES

EXHAUST OF FRESH AIR THROUGH 40cm VENT (5)

1-ENSURE THAT ALL CABLE CUTS ARE SEALED PROPERLY (9)
2-TEMPERATURE READING INCORRECT ACTUAL TEMP 30C WITH RETURN AIR MEASURED AT 20.6C (3)
3-CHECK & REMOVE ALL FLOOR TILE GAPS (8)
4-INFLOW OF FRESH AIR THROUGH 40cm VENT TEMPERATURE MEASURED AT 18.5C WITH PLENUM TEMP AT 15C AVG (6)
5-REMOVE HIGH FLOW PERF TILES FROM END OF AISLES OR REPLACE WITH LOWER FLOW ONES IF REQUIRED (13)
6-INSTALL PANEL TO SEPARATE HOT AIR FROM INLET TO STORAGE RACK (18,19,20,21,22 & 23)
7-INSTALL IN RACK BLANKING PANELS TO PREVENT RE-CIRC (24)
8-INSTALL PERF TILES TO PROVIDE AIR CURTAIN WITH HIGH TO LOW FLOW ALONG THE ROW. (25)
9-SHIELD TO PREVENT COLD AISLE RECEIVING HOT AIR FROM REAR OF OTHER SERVERS
10-CLOSE HOLES IN THE RACKS TO PREVENT COLD AIR RE-CIRC. (26 & 27)
11-CLOSE OFF ALL FLOOR OPENINGS TO PREVENT AIR ESCAPE (4 & 7)
12-CLOSE RACK GAP TO PREVENT RE-CIRC (10), PLACE IN RACK BLANKING PLATES TO REDUCE RE-CIRC (11 & 12)
13-REMOVE DOORS IN HOT AISLES AND SEAL UP ALL UNDER FLOOR AIR LEAKS
14-LOW FLOW PERFS REQUIRED TO SAVE STORAGE UNIT. INSTALL SHIELD TO PREVENT HOT AIR FROM SERVERS BEING DIRECTED INTO THE INLET
15-REDUCE PERFS IN COLD AISLE BUT KEEP THE FIRST TO HIGH FLOW PERFS TO ACT AS AIR CURTAIN. CONSIDER BLOCKING OFF END OF THE COLD AISLE
16-INSTALL BLANK RACK TRAIN TO SEPERATE HOT AND COLD AISLES (14, 15, 16 & 17)
17-CONSIDER THE HEAT LOAD OF THE P SERIES MACHINES AS A SPECIAL CASE
18-BOX IN THE 3 SERVER RACKS TO PREVENT RE-CIRC. REDUCE PERF TILE FLOW TO RE-DIRECT THE FLOW TO THE BOTTOM OF THE D SERVERS (14, 15, 16 & 17)
19-CLOSE OFF IN RACK GAPS TO PREVENT RE-CIRC. (1 & 2)
20-REPLACE RACK SIDE PANELS WITH SOLID ONES TO PREVENT HOT AIR RE-CIRC.
21-INSTALL PERF TILES TO FEED BOTH SIDES OF THE DUAL INLET MACHINE

KNOWLEDGE-BASED MODELS FOR DATA CENTERS

FIELD OF THE INVENTION

The present invention relates to data center analysis, and more particularly, to techniques for knowledge-based thermal modeling in data centers.

BACKGROUND OF THE INVENTION

Power and energy consumption have become a critical issue for data centers, with the rise in energy costs, supply and demand of energy and the proliferation of power hungry information and communication technology (ICT) equipment. Data centers consume approximately two percent (%) of all electricity globally or 183 billion kilowatt (KW) hrs of power, and this consumption is growing at a rate of 12% each year. Energy efficiency now is becoming a critical operational parameter for data center managers for a number of key reasons, including the cost of power is rising, the demand for power is increasing, access to power from the power grid is becoming an issue for many data centers, energy usage creates excessive heat loads within the data center, awareness of green technologies and carbon footprint impact and the introduction of industry-wide codes of conducts and legislation for green information technology (IT).

In a typical data center, power usage can be broken down into power used for the operation of the ICT equipment and power required for infrastructure (such as chillers, humidifiers, air conditioning units (ACUs), power distribution units (PDUs), uninterruptable power supplies (UPS), lights and power distribution equipment). For example, after losses due to power production and delivery and losses due to cooling requirements, only about 15% of the power supplied to a data center is used for IT/computation, the rest is overhead. See, also, P. Scheihing, "Creating Energy-Efficient Data Centers," Data Center Facilities and Engineering Conference, Washington, D.C. (May 18, 2007), the contents of which are incorporated by reference herein.

Therefore, techniques for improving data center energy efficiency would be desirable.

SUMMARY OF THE INVENTION

The present invention provides techniques for data center analysis. In one aspect of the invention, a method for modeling thermal distributions in a data center is provided. The method includes the following steps. Vertical temperature distribution data is obtained for a plurality of locations throughout the data center. The vertical temperature distribution data for each of the locations is plotted as an s-curve, wherein the vertical temperature distribution data reflects physical conditions at each of the locations which is reflected in a shape of the s-curve. Each of the s-curves is represented with a set of parameters that characterize the shape of the s-curve, wherein the s-curve representations make up a knowledge base model of predefined s-curve types from which thermal distributions and associated physical conditions at the plurality of locations throughout the data center can be analyzed.

The vertical temperature distribution data can be obtained for a time T=0 and the method can further include the following steps. Real-time temperature data can be obtained for a time T=1, wherein the real-time data is less spatially dense than the data obtained for time T=0. The real-time data can be interpolated onto the data obtained for time T=0 to obtain updated vertical temperature distribution data for the plurality of locations. The updated vertical temperature distribution data for each of the locations can be plotted as an updated s-curve, wherein the updated vertical temperature distribution data reflects updated physical conditions at each of the locations which is reflected in a shape of the updated s-curve. The updated s-curves can be mated to the predefined s-curve types in the knowledge base model.

A more complete understanding of the present invention, as well as further features and advantages of the present invention, will be obtained by reference to the following detailed description and drawings.

BRIEF DESCRIPTION OF THE DRAWINGS

FIG. 7 is a graph on which another exemplary representation of s-curves is presented according to an embodiment of the present invention;

FIG. 13 is a diagram illustrating how physical behaviors can be input into the model according to an embodiment of the present invention.

DETAILED DESCRIPTION OF PREFERRED EMBODIMENTS

Presented herein are techniques for modeling temperature distributions in a data center. By being able to better understand the thermal conditions in a data center, best energy practices can be implemented thus improving overall energy efficiency. It is notable that while the instant techniques are described in the context of a data center, the concepts presented herein are generally applicable to temperature distribution analysis in spaces such as buildings, factories (in particular semiconductor factories) or assembly of buildings (cities), as well as in data centers (locations are selected, e.g., based on the heat density, the more heat there is, it is more important to manage the energy).

Figure 1:
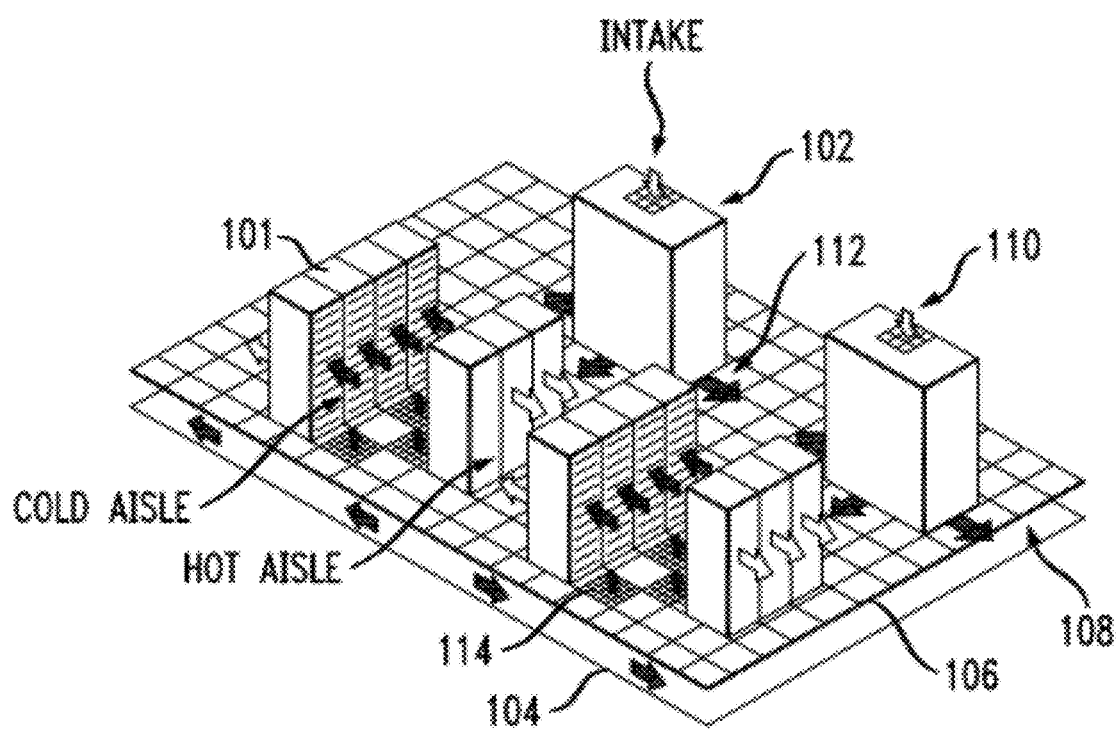
FIG. 1 is a diagram illustrating an exemplary data center according to an embodiment of the present invention.

FIG. 1 is a diagram illustrating exemplary data center 100. Data center 100 has server racks 101 and a raised-floor cooling system with air conditioning units (ACUs) 102 (which may also be referred to as computer room air conditioners (CRACs)) that take hot air in (typically from above through one or more air returns in the ACUs) and exhaust cooled air into a sub-floor plenum below. Hot air flow through data center 100 is indicated by light arrows 110 and cooled air flow through data center 100 is indicated by dark arrows 112. In the following description, the data center above the sub-floor plenum may also be referred to simply as the raised floor, and the sub-floor plenum may be referred to simply as the plenum. Thus, by way of example only, as shown in FIG. 1, the ACUs intake warm air from the raised floor and expel cooled air into the plenum (see below).

In FIG. 1, server racks 101 use front-to-back cooling and are located on raised-floor 106 with sub-floor 104 beneath. Namely, according to this scheme, cooled air is drawn in through a front (inlet) of each rack and warm air is exhausted out from a rear (outlet) of each rack. The cooled air drawn into the front of the rack is supplied to air inlets of each IT equipment component (servers for example) therein. Space between raised floor 106 and sub-floor 104 defines the sub-floor plenum 108. The sub-floor plenum 108 serves as a conduit to transport, e.g., cooled air from the ACUs 102 to the racks. In a properly-organized data center (such as data center 100), racks 101 are arranged in a hot aisle-cold aisle configuration, i.e., having air inlets and exhaust outlets in alternating directions. Namely, cooled air is blown through perforated floor tiles 114 (also referred to as vents) in raised-floor 106, from the sub-floor plenum 108 into the cold aisles. The cooled air is then drawn into racks 101, via the air inlets, on an air inlet side of the racks and dumped, via the exhaust outlets, on an exhaust outlet side of the racks and into the hot aisles.

The ACUs typically receive chilled water from a refrigeration chiller plant (not shown). Each ACU typically comprises a blower motor to circulate air through the ACU and to blow cooled air, e.g., into the sub-floor plenum. As such, in most data centers, the ACUs are simple heat exchangers mainly consuming power needed to blow the cooled air into the sub-floor plenum. Typically, one or more power distribution units (PDUs) (not shown) are present that distribute power to the server racks 101.

Figure 2:
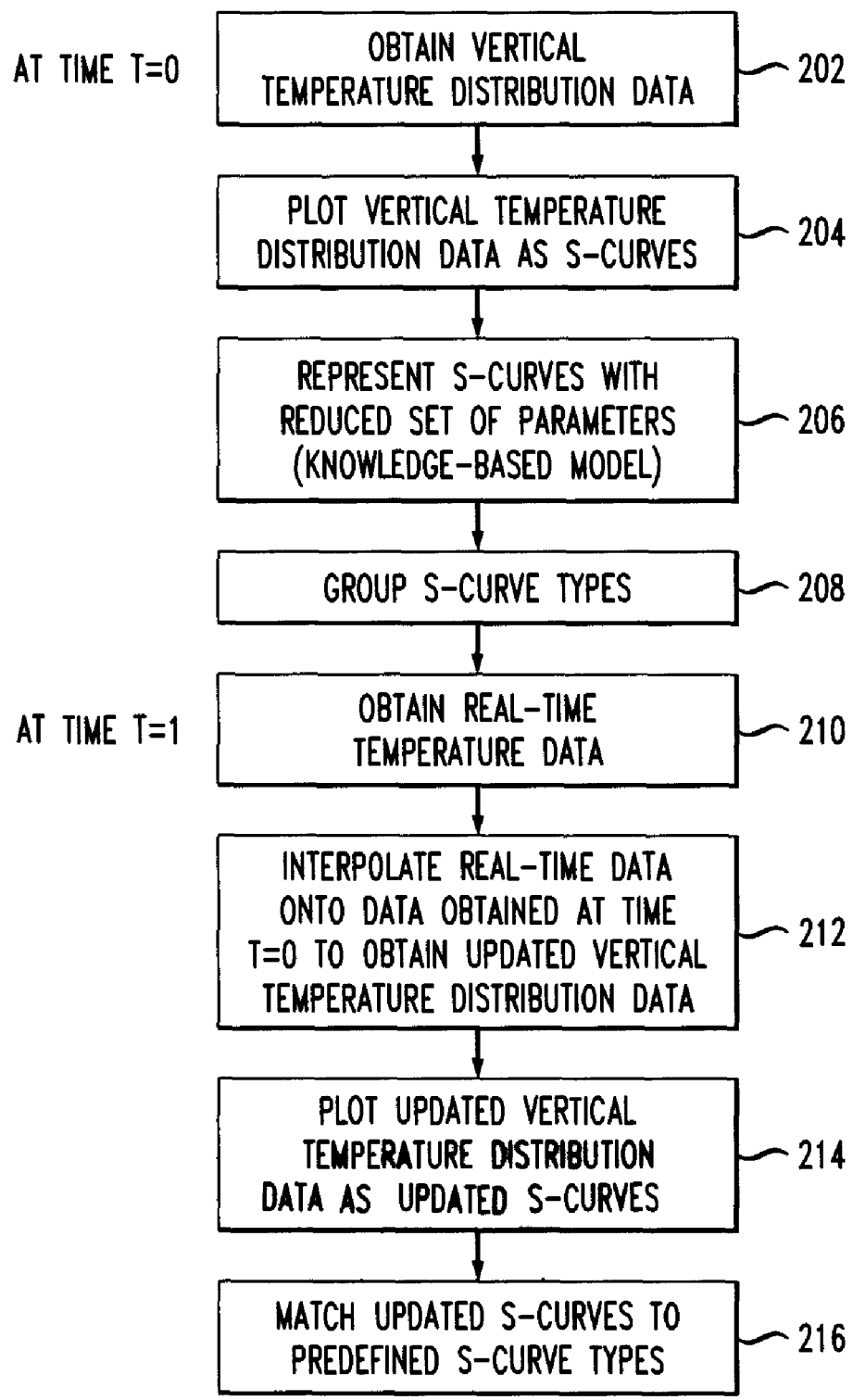
FIG. 2 is a diagram illustrating an exemplary methodology for modeling thermal distributions in a data center according to an embodiment of the present invention.

FIG. 2 is a diagram illustrating an exemplary methodology 200 for modeling thermal distributions in a data center, such as data center 100 described, for example, in conjunction with the description of FIG. 1, above. In step 202, vertical temperature distribution data is obtained for a plurality of locations throughout the data center. The vertical distribution data can be obtained using, e.g., mobile measurement technology (MMT). According to an exemplary embodiment, the vertical temperature profiles at the air inlet sides of the server racks are modeled (see below). Thus, in that case the vertical temperature distribution data is obtained at an air inlet side of each of one or more of the server racks in the data center.

As will be described in detail below, MMT data is spatially dense, but temporally sparse (readings are generally taken only about once a year since such a comprehensive scan takes a relatively long time to complete). Thus, for example, the vertical temperature distribution data is obtained, e.g., via MMT, for a time T=0. The data can however be updated with "real-time" temperature data obtained, e.g., using sensors placed throughout the data center (see below). As will be described in detail below, these real-time sensors can provide temporally dense readings, but are spatially sparse (e.g., one sensor per rack) as compared with the MMT scans.

In step 204, the vertical temperature distribution data for each of the locations is plotted as an s-curve. S-curves are described in detail below. In general however it has been found by way of the present teachings that the vertical temperature profile in a data center, e.g., at the inlet sides of the racks, when plotted as a function of temperature and height, exhibit an s-curve shape, with plateaus at the top and bottom. Advantageously, the vertical temperature distribution data reflects physical conditions at each of the locations which is reflected in a shape of the s-curve. By way of example only, physical conditions that may be present in the data center which can affect the shape of the s-curve include, but are not limited to, server rack location in the data center, distance of server rack to air conditioning units, server rack height, thermal footprint, server rack exposure, ceiling height, distance to nearest tile, air flow delivered to the server rack from the air conditioning units, openings within the server rack, power consumption of server rack and air flow demand of server rack. Namely, these aforementioned conditions can affect the vertical temperature profile and thus the shape of the resulting s-curve. As will be described in detail below, this discovery allows the physical conditions to be represented by a reduced set of parameters, e.g., that characterize the shape of the s-curve.

To that point, in step 206, each of the s-curves is represented with a set of parameters that characterize the shape of the s-curve. These s-curve representations make up a knowledge base model of predefined s-curve types from which thermal distributions and associated physical conditions at the plurality of locations throughout the data center can be analyzed. According to an exemplary embodiment, the parameters include one or more of a lower plateau of the s-shaped curve, an upper plateau of the s-shaped curve, s-shape-ness in an upper part of the s-shaped curve, s-shape-ness in a lower part of the s-shaped curve and height at which a half point of the s-shaped curve is reached. These parameters will be described in detail below. The set of parameters also preferably includes one or more parameters describing the particular location in the data center for which the s-shaped curve is a plot of the vertical temperature distribution. See below.

In step 208, the predefined s-curve types can be grouped based on parameter similarities. By way of example only, s-curve types can be grouped by slope at 50% point, e.g., those s-curves with a slope of from 10° C./feet to 20° C./feet are grouped together, those with a slope of from 21° C./feet to 30° C./feet are grouped together, and so on. Since, as highlighted above, the predefined s-curve types reflect physical conditions in the data center such as distance of a server rack to an air conditioning unit, etc., by grouping these s-curve types together patterns will emerge. Further, since the s-curves are preferably tied to a particular location (i.e., through a parameter(s) that describe the particular location in the data center for which the s-shaped curve is a plot of the vertical temperature distribution, see above), the patterns can also be linked to particular areas of the data center. See below.

In step 210, real-time temperature data is obtained for a time T=1. As highlighted above, this real-time temperature data can be obtained from real-time sensors. While the data obtained from the real-time sensors is less spatially dense than the data, e.g., from a MMT scan, the real-time data can be used to update the MMT data to reflect any changes in the data center that occurred, e.g., from time T=0 to time T=1.

In step 212, the real-time data is interpolated onto the data obtained for time T=0 to obtain updated vertical temperature distribution data for the plurality of locations. Exemplary interpolation techniques are described in detail below. In step 214, the updated vertical temperature distribution data for each of the locations is plotted as an s-curve. As described above, the vertical temperature distribution data reflects physical conditions (in this case updated physical conditions) at each of the locations which is reflected in a shape of the s-curve. In step 216, the updated s-curves are mated (also referred to herein as typecasted) to the predefined s-curve types in the knowledge base model. Mating/typecasting techniques are described in detail below.

Inlet Temperatures: As highlighted above, according to an exemplary embodiment, the vertical temperature profiles at the air inlet sides of the server racks are modeled. American Society of Heating, Refrigerating and Air-Conditioning Engineers (ASHRAE) describes server rack air inlet temperatures as temperature of "the inlet air entering the datacom equipment." 2008 ASHRAE Environmental Guidelines for Datacom Equipment, Expanding the Recommended Environmental Envelope. In a data center, inlet temperatures are important as they can affect the reliability of the ICT equipment, e.g., servers, network, storage etc. Most data centers are often overcooled in order to maintain air inlet temperatures at a required level, resulting in energy waste. There is a trade-off between maintaining air inlet temperatures and the energy required to do it. Namely, lower inlet temperatures means more cooling, which costs more energy while higher inlet temperatures translates into less cooling, which costs less energy. This is a consequence of the second law of thermodynamics.

Many methodologies and best practices have been employed to optimize data centers to make it easier to maintain air inlet temperatures while keeping costs to a minimum, for example, hot and cold aisle separation and containment. Containment is a way to enclose cold aisles so hot air cannot get into a cold aisle (which prevents hotspots due to "recirculation").

The key to providing confidence (control of air inlet temperatures) and delivering energy savings to data centers is the understanding of datacenter dynamics, coping with changes in room configuration and systematic implementation of energy saving initiatives. If data center dynamics can be understood and risk minimized or eliminated, energy levels in the data center can be raised and costs reduced. Modeling is one technique that can be used to understand data center dynamics.

Data center Modeling: Data centers are very dynamic environments. To understand in detail the characteristics of a data center, high resolution data is required. Mobile measurement technology (MMT) as described, for example, in U.S. Pat. No. 7,366,632, issued to Hamann et al., entitled "Method and Apparatus for Three-Dimensional Measurements" (hereinafter "U.S. Pat. No. 7,366,632"), the contents of which are incorporated by reference herein, is an example of capturing high spatial resolution data for data center characterization.

With MMT, a temperature sensor grid mounted on a cart is used to map out three-dimensional temperature distributions in a room, such as a data center. The sensors are mounted at various heights from the ground and lateral locations with spacing less than a foot apart. However, the data MMT provides is only a snapshot in time. The data center changes by the minute as ACUs switch on and off, server heat loads change, equipment is added, reconfigured or removed affecting the behavior (i.e., the heat distribution or temperature distributions) of the data center room.

As it is not feasible to place high spatial resolution sensing equipment in the data center on a permanent basis, the dynamics of the datacenter need to be understood by generating a representation of the data center in the form of a model. If a valid model of the data center can be generated, lower spatial resolution sensing (obtained on a more frequent basis) can be introduced as control points or boundaries on the model while utilizing the high resolution data (obtained less frequently using, e.g., MMT) as a base model. Valid models can be both base models and dynamic models. The term "valid model" refers to a model which is creating an accurate description of the real heat distribution. According to an exemplary embodiment, the lower spatial resolution sensing is obtained using sparsely placed sensors (e.g., one sensor per server rack) throughout the room, i.e., data center. Changes in the data center can be detected by these sparsely placed sensors and the model can be adjusted to signify the changes in the data center environment. In addition, as the model is computer accessible, analytics, alarms and alerts can be applied to the model for interaction with human users.

Figure 3A:
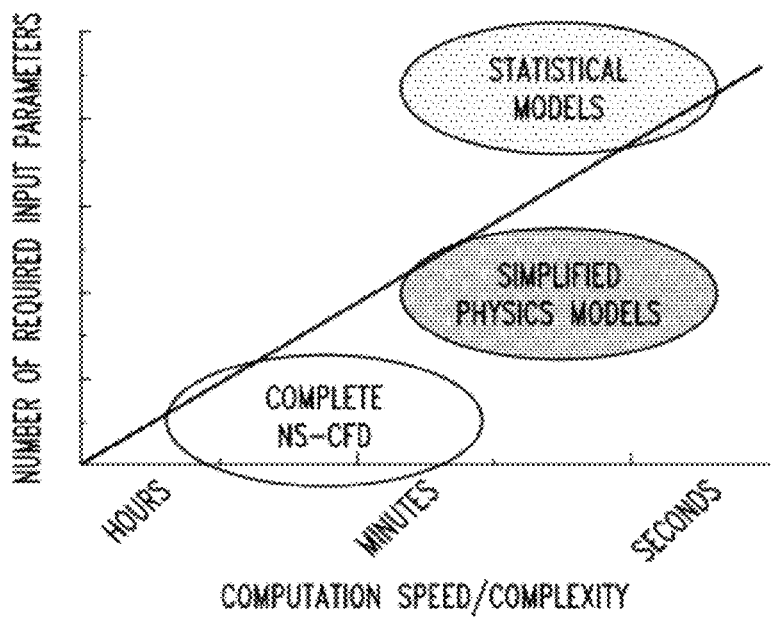
FIG. 3A is a graph illustrating computational speed/complexity as a function of the number of required input parameters for complete Navier Stokes-computational fluid dynamics (NS-CFD) models, simplified physics models and statistical models according to an embodiment of the present invention.
Figure 3B:
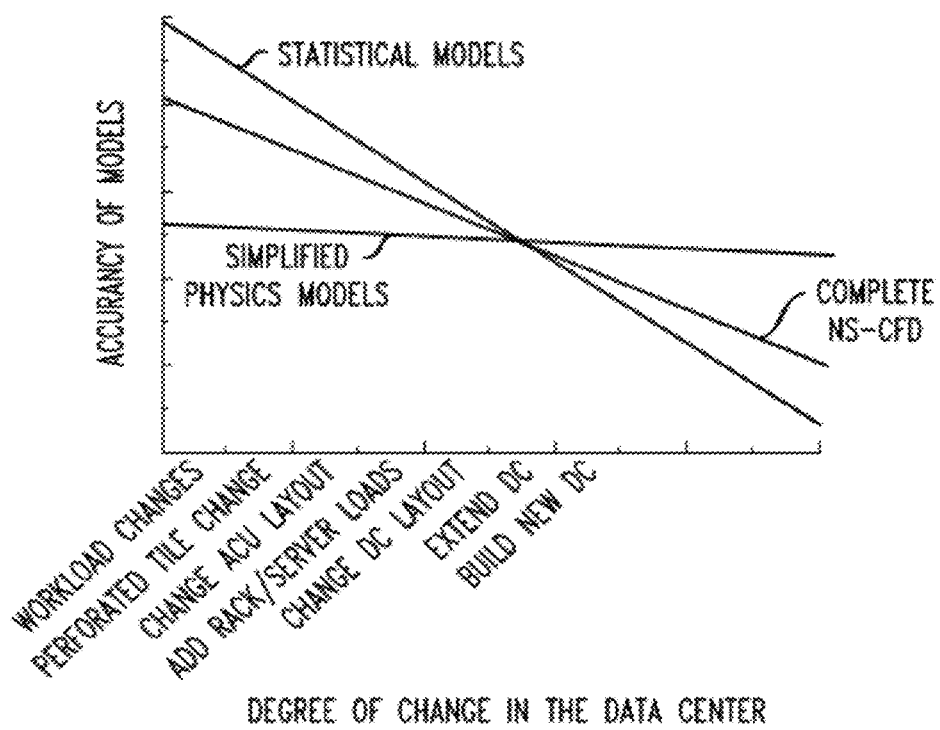
FIG. 3B is a graph illustrating degree of change in the data center as a function of the accuracy of the models for complete NS-CFD models, simplified physics models and statistical models according to an embodiment of the present invention.

Creating a model of a data center can take many forms, from complex numerical physics-based models to statistical models. This is a complex task with tradeoffs between accuracy, flexibility and computation time. Models such as computational fluid dynamics (CFD) can accurately describe (simulate) a data center with the minimum of input parameters and is not sensitive to changes. Computation however is time consuming with a CFD model. Statistical models on the other hand are fast to solve but are very sensitive to changes and lose accuracy, i.e., statistical models are not very accurate to make predictions if changes occur or "what-if" scenarios are tested. These trends are depicted in FIGS. 3A-B. FIG. 3A is a graph 300A illustrating computational speed/complexity as a function of the number (#) of required input parameters for complete Navier Stokes (NS)-CFD models, simplified physics models and statistical models. FIG. 3B is a graph 300B illustrating degree of change in the data center (DC) as a function of the accuracy of the models for complete NS-CFD models, simplified physics models and statistical models.

The CFD approach uses numerical methods and computer algorithms to solve and analyze a physics equation governing fluid flow and heat transfer. The fundamental physics is given by the Navier Stokes equations, which describe any single-phase fluid flow. These equations for fluid flow can be simplified by removing terms describing viscosity (yielding Euler equations) and by removing terms describing vorticity, which yields the potential equations. These potential equations can be linearized. Here it is preferred to solve these linearized potential equations (which is an easier and faster calculation than with the CFD approach). Once the flow field has been calculated the heat conduction—convection equations are solved using similar computational, numerical methods as described, for example, in U.S. patent application Ser. No. 12/146,852 filed by Hamann et al., entitled "Techniques for Thermal Modeling of Data Centers to Improve Energy Efficiency" (hereinafter "U.S. patent application Ser. No. 12/146,852")," the contents of which are incorporated by reference herein.

Knowledge-base Models: The present techniques involve a new method to model temperature distributions based on a knowledge-base, which is created using large amounts of experimental data. This "knowledge-based model" is complemented with basic physics principles, such as energy balance, as well as real-time data to update the model. Furthermore, in one exemplary embodiment, knowledge-based models are used as trends for interpolation techniques (e.g., kriging), where sparse sensor data is used to predict complete temperature fields (for more information see also U.S. patent application Ser. No. 12/146,952 filed by Amemiya et al., entitled "Techniques to Predict Three-Dimensional Thermal Distributions in Real-Time" (hereinafter "U.S. patent application Ser. No. 12/146,952"), the contents of which are incorporated by reference herein.

The present techniques leverage semi-empirical trends and patterns of measured temperature distributions. The knowledge base is furbished and enhanced by both experimental data and basic physical principles. One application of this knowledge base provides trending functions off spatial kriging to more accurately predict complete temperature fields based on sparse sensor data.

Figure 5:
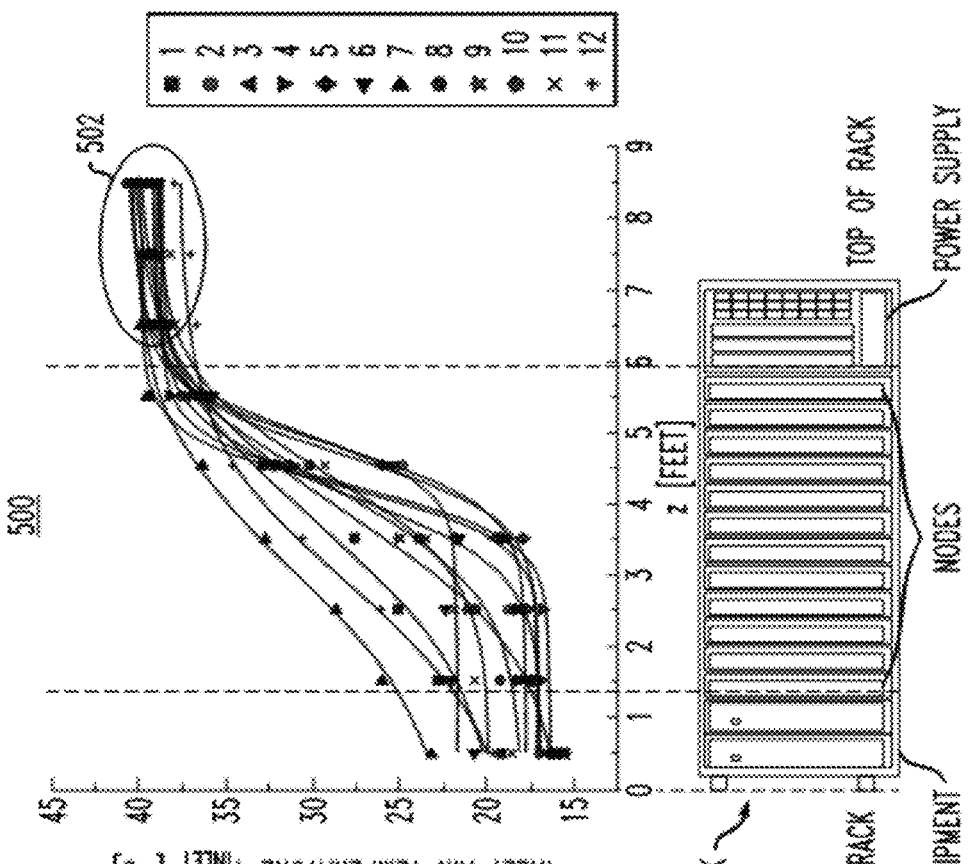
FIG. 5 is a graph on which inlet temperatures to 12 server racks in the data center of FIG. 4 have been plotted according to an embodiment of the present invention.
Figure 4:
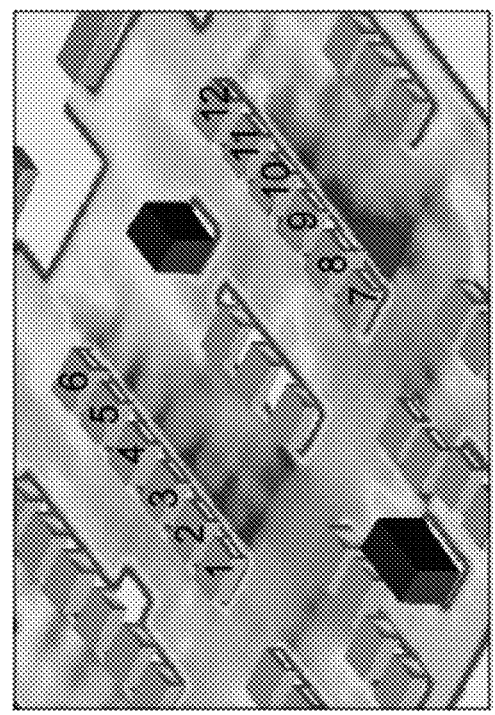
FIG. 4 is an image representing a slice of a mobile measurement technology (MMT) scan of a data center according to an embodiment of the present invention.

An example of the present techniques is described in the following. The temperature distributions of a data center were obtained by MMT, which is described, for example in U.S. Pat. No. 7,366,632 and in Hamann et al., "Uncovering Energy-Efficiency Opportunities in Data Centers," IBM Journal of Research and Development, vol. 53, no. 3 (2009) (hereinafter "Hamann"), the contents of which are incorporated by reference herein. In this example, MMT data feeds the knowledge base. FIG. 4 is an image 400 representing a slice of an MMT scan of the data center, wherein 12 server racks are labeled (i.e., 1-12). FIG. 5 is a graph 500 on which the vertical temperatures of inlet temperatures to the 12 server racks have been plotted. Specifically, in graph 500 distance from the bottom of the server rack z (measured in feet) is plotted on the x-axis and inlet air temperature $T_{inlet}$ (measured in degrees Celsius (° C.)) is plotted on the y-axis. An image of a server rack is provided below graph 500 to illustrate how the server height aligns with the thermal profiles. As shown in graph 500 the server rack is about seven feet high and contains 12 nodes (a node, or computational node, is a server). The nodes, for which the inlet temperature distributions need to be modeled as well as maintained accurately, are from about 1.5 feet to about six feet, i.e., from the ground. Power supply and network equipment are present at the top and bottom of the rack, respectively. The data in FIG. 5 clearly show that there are certain trends, which can be used to build a knowledge-based model and leveraged for model predictions. As shown further below, these trends can be (more accurately) described/represented using some basic physical principles.

In detail, all temperature profiles in FIG. 5 show some type of "s-shaped" behavior—with a plateau at the bottom and at the top. This behavior is referred to hereinafter as an s-curve, which is used to describe the vertical temperature profile across the inlets of a server rack. It is notable that this s-curve T(z) is also a function of the lateral location (T=f(x,y)) of the rack, which is described further below.

Semi-empirical trends from MMT and/or other measurements, such as flow measurements which may or may not be part of the MMT process, are used to derive a (reduced order) representation of a thermal profile (with a limited number of parameters). See below. These parameters are related to other known physical conditions of the data center such as rack location, distance of rack to ACUs, rack height, thermal footprint, rack exposure, ceiling height, distance to the nearest tile, air flow delivered to the server rack from the ACU, openings within the server rack, power consumption and air flow demand of the server rack. The MMT data includes the three-dimensional temperature distribution T(x,y,z). Typically, MMT data also includes layout data of the data center, such as the coordinates, dimensions of all the racks, ceiling heights, walls, ACUs etc. Every s-curve can be associated with a rack. The rack coordinates and dimensions are known. Thus, it can be determined how these coordinates relate to the, e.g., ACU coordinates, thereby later permitting recall of what parameter(s) result in a given curve shape. It is also shown by the highlighted portion 502 that the variations of the upper plateau $T_h$/ceiling temperatures are low. See further discussion below.

Figure 6:
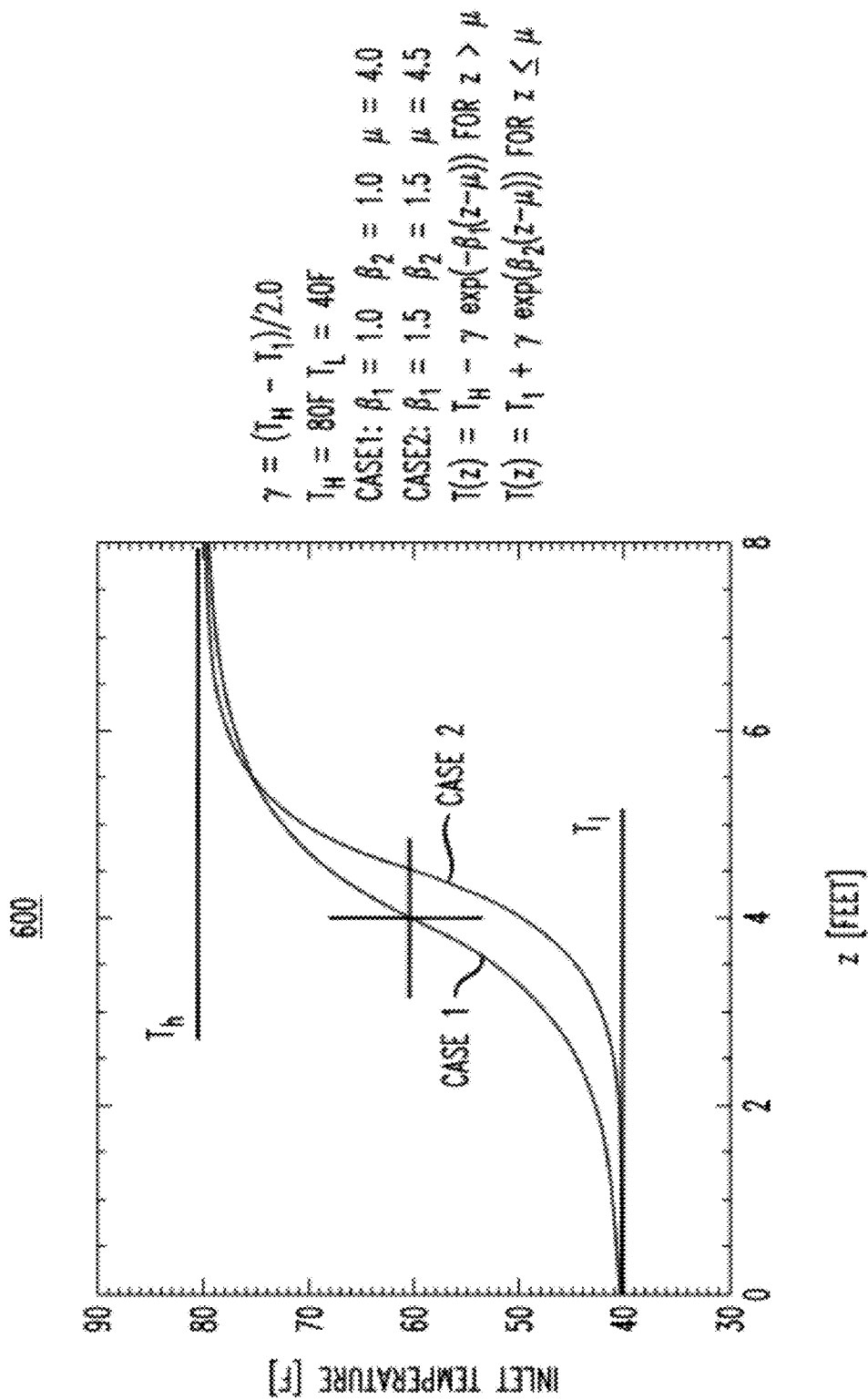
FIG. 6 is a graph on which an exemplary representation of s-curves is presented according to an embodiment of the present invention.

Two exemplary descriptions/representations of these s-curves are presented in FIGS. 6 and 7. The parameters of these representations are populated to create the knowledge base. Namely, FIG. 6 is a graph 600 on which the s-curves are represented with the following representation:

$$\gamma = (T_H - T_l)/2.0$$

$$T(z) = T_H - \gamma \exp(-\beta_1(z-\mu)) \text{ for } z > \mu$$

$$T(z) = T_l + \gamma \exp(\beta_2(z-\mu)) \text{ for } z \leq \mu \quad (1)$$

wherein z is the distance from the bottom of the server rack.

In graph 600, z (measured in feet) is plotted on the x-axis and inlet air temperature (measured in degrees Fahrenheit (° F.)) is plotted on the y-axis. The parameters of these representations are the lower and upper plateaus ($T_l$ and $T_h$, respectively), a $\beta 1$ and $\beta 2$ factor for s-shape-ness in the upper and lower part of the curve and slope of the curve at the 50% point. The parameter $\mu$ is the height at which the half point (50% point) is reached, i.e., the half point of the temperature increase (from $T_h$ to $T_l$). For example, if $T_h=40$ and $T_l=20$ the parameter $\mu$ will give us the height at which T=30.

These parameters will be obtained from the knowledge-base. Namely, as described above, initially these parameters are used to populate the knowledge base. The air flow, for example, associated with each rack and thus with each parameter set is also recorded. Eventually, one starts creating a knowledge base of how the parameters depend on the air flow which will be used in the future for "what if" scenarios as discussed further below. As highlighted above, the parameters are $T_l$, $T_h$, $\beta 1$, $\beta 2$ and $\mu$, and z is a variable and T is the output of the function.

FIG. 7 is a graph 700 on which another (alternative) exemplary description/representation of these s-curves is presented based on the following equation:

$$T(z) = T_1 + \frac{T_h - T_1}{1 + 10^{(\log \times 0 - z)p}} \quad (2)$$

In graph 700, z (measured in feet) is plotted on the x-axis and inlet air temperature $T_{inlet}$ (measured in degrees Celsius (° C.)) is plotted on the y-axis. While Equation 1, above, allows for asymmetry of the s-behavior in the lower and upper part of the s-curve, here (in Equation 2) this behavior is neglected. The log(x0) parameter gives the z value at which 50% is reached between the lower and upper plateau and following equation gives the slope at the 50%. i.e., $$dT(z=\log(x0))/dz = p \cdot \ln(10) \cdot (T_h - T_l).$$

$T_l$ and $T_h$ can be obtained from real-time measurements (discharge and return temperature of ACUs). The discharge temperatures of the ACU determine $T_l$ because that is the air which is supplied to the bottom of the rack—while the return temperatures relate to $T_h$ because that is representative of the temperatures at the top of the server rack. The data center thermal profiles (i.e., the vertical temperature profiles shown, e.g., in FIG. 5) are then represented with an s-shape curve(s). The slope and 50% point of the curve represent recirculation and air flow characteristics of rack. As will be described in further detail below, the slope and 50% point can be related to a "level" of recirculation and air flow characteristics. For example, if the servers "demand" more air (by pulling with the fans in the server) than what is supplied through the perforated tiles, low pressure builds up in front of the rack and typically warmer air from the surrounding areas moves into the cold aisle. That would move the 50% point towards lower values (meaning the 50% point occurs closer to the bottom of the server rack).

Parameters are then fit (here x0 and p) as a function of rack location. As will be described in detail below, the parameters x0 and p will depend on "where" the rack is. For example, a rack at the corner of an aisle is more prone to recirculation, which means that low x0 and possibly lower p values will be found (see, for example, FIG. 9, described below).

It is notable that both representations (see FIG. 6 and FIG. 7) leverage basic physical principles, which are investigated in the following. Both representations use parameters describing the lower and upper plateau, as well as parameters representing the slope of the s-curve at different z-heights between these plateaus (e.g., the slope of the curve at the 50% point). Although s-types of vertical temperature profiles are found throughout the data center, this s-shape concept is particularly important at the locations of the inlets of the servers (because it is desirable to maintain the temperatures on the inlet side). In order to meet system reliability, the right inlet temperatures need to be provided.

The parameters of the representation are now described. The lower plateau (T low or $T_l$) is governed by a respective plenum temperature distribution $T_p(x,y)$ (i.e., the temperature distribution in the plenum dictates the temperature of the air at the perforated tiles which is supplied to the bottom of the rack. Simple concepts for calculating plenum temperature distributions are described, for example, in U.S. patent application Ser. No. 12/146,852, and in U.S. patent application Ser. No. 12/540,034, entitled "Methods and Techniques for Creating and Visualizing Thermal Zones," (hereinafter "U.S. patent application Ser. No. 12/540,034"), the contents of which are incorporated by reference herein, and in U.S. patent application Ser. No. 12/146,952. In general however, it is noted that plenum temperature distributions can be calculated/estimated by various means and/or a combination of these means. For example, in one exemplary embodiment standard interpolation techniques (inverse distance weighting, spatial kriging, etc.) of measured (preferably real-time) discharge temperatures from (preferably) each ACU and/or plenum temperature sensors are used. In another exemplary embodiment (computation fluid dynamics) CFD calculations can be used (preferably two-dimensional as opposed to three-dimensional, because two-dimensional calculations can be performed faster) as described in U.S. patent application Ser. Nos. 12/146,852 and U.S. Patent application Ser. No. 12/540,034. The boundary conditions for these calculations can be obtained from measured (preferably real-time) temperature and air flow values. Specifically, air flow values can be derived from (preferably real-time) air pressure measurements. In combination with the tile flow impedance (or resistance of the perforated tile for the air) and knowing the pressure differential (the pressure differential between plenum and raised flow), the air flow values (and thus the input values for the boundaries to solve the physics equations) can be calculated.

The lower plateau can be also calculated from the upper plateau using Equation 3 as discussed below (i.e., $T_l$ can be obtained from $T_h$, and vice versa, see below). It is notable that other techniques can be used to determine $T_l$. For example, $T_l$ could be set directly constant from a knowledge base, which would be around 60° F. for a typical data center. 60° F. is often the default value for computer room ACUs.

The plenum temperature distribution $T_p(x,y)$ determines the tile discharge temperature. Ideally, a perforated tile is placed at the inlet side of the server rack and thus one can (directly) equate the plenum temperature at a particular server inlet location to $T_l$. However often, there is some distance between the server inlet location and the nearest perforated tile. Here the knowledge base is used which relates $T_l$ to the nearest (or set of nearest) perforated tile(s), for example by $T_l = T_p * t$, where t depends on the distance, and possibly air flow between the server rack inlet location and the nearest or nearest set of perforated tiles. In one particular exemplary embodiment the air flow from the perforated tiles is convoluted with a kernel function (for example a Lorentzian function, which has a 1/distance dependence).

The upper plateau (T high or $T_h$) is governed by the respective ceiling temperatures of the data center. As evident from the highlighted portion 502 of FIG. 5 (described above) the variations of the upper plateau $T_h$/ceiling temperatures are low (which means that the $T_h$ values of the different profiles are less than +/– two °C.—see also FIG. 9, described below). This plateau can be estimated by any one, or a combination of, the following methods. In one exemplary embodiment standard interpolation techniques (inverse distance weighting, spatial kriging, etc.) of measured (preferably real-time) return temperatures from (preferably) each ACU and/or ceiling temperature sensors are used. By way of example only, with the inverse distance method, for example, for a three-dimensional case:

weights:
$$w_{ij} = \frac{1}{(r_{ij}+c)^b} \cdot \exp(-mu \cdot r_{ij})$$

distances:
$$r_{ij} = \sqrt{(x_i - x_j)^2 + (y_i - y_j)^2}$$

interpolated z values
$$T_j(x,y) = \sum_{i=0}^{n-1} w_{ij} z_i \Big/ \sum_{i=0}^{n-1} w_{ij}$$

wherein:
x,y coordinates
T value (data points)
n numbers of values
i data point index
j interpolation point index
$w_{ij}$ weight
$r_{ij}$ distance between interpolation point and data point
c smooth parameter
b exponent
mu attenuation distance In another exemplary embodiment, CFD calculations are used. Here, for example, linearized potential equations can be applied to calculate a generic air flow field followed by solving for the temperature fields using heat conduction-convection equations. In yet another exemplary embodiment, the upper plateau can be related to the lower plateau via total power consumption and air flow by leveraging the following physics relationship:

$$T_h - T_l = 3140 \ [\text{cfm} \cdot °\text{F./kW}] \cdot \text{power/flow}. \quad (3)$$

In order to illustrate Equation 3, assume for example that the data center has one ACU that generates an air flow of 12,000 cubic feet per minute (cfm) and the total dissipated power in the data center is 80 kilowatts (kW). Using Equation 3, $T_h - T_l = 21$ degrees Fahrenheit (° F.) is obtained. For example, if $T_l = 60°$ F., $T_h$ will be on average 81° F. Equation 3 is also useful to estimate the impact as, for example, the air flow is throttled down (i.e., to save energy) and/or the power dissipation is changed.

From a physical point of view, the s-shape between the upper and lower plateau is readily rationalized by the fact that in typical data centers some level of "recirculation" occurs. For example, if not enough cold air is ejected from the perforated tiles and thus it does not match the requirements from the servers' fans, air from the ceiling will be drawn onto the inlet side of the racks. As highlighted above, the server fans push a certain amount of air through the server—if the air is not supplied through the perforated tile a low pressure region is created in front of the server and other air from the surrounding area(s) is taken in, which is typically hotter—that phenomena is referred to as "recirculation." Thus, for the most part, if there is enough cool air provided no (or minimal) recirculation occurs. Depending on this mismatch you will find different s-shape-ness as well as different 50% points between the lower and higher plateaus. Server racks, which are at the edges of a longer cold aisle, might have more exposure to warmer air. Clear evidence for this is shown in FIGS. 4 and 5, described above, wherein server racks 1, 6, 7 and 12 show less step steep s-curves, which can be attributed to their increased exposure to hot air making recirculation more likely.

Figure 8A:
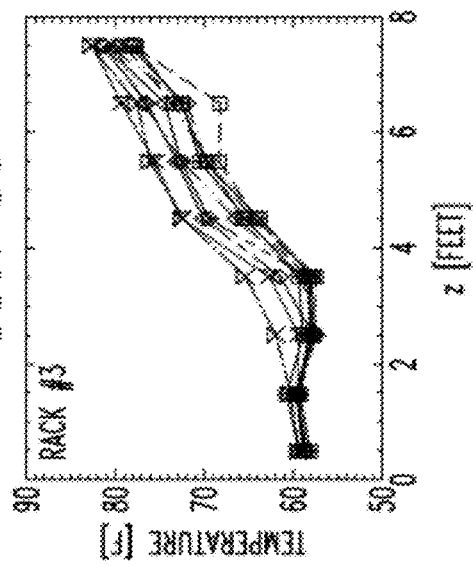
FIGS. 8A-O are graphs illustrating the vertical temperature distribution of 15 server racks in a small data center according to an embodiment of the present invention.
Figure 8B:
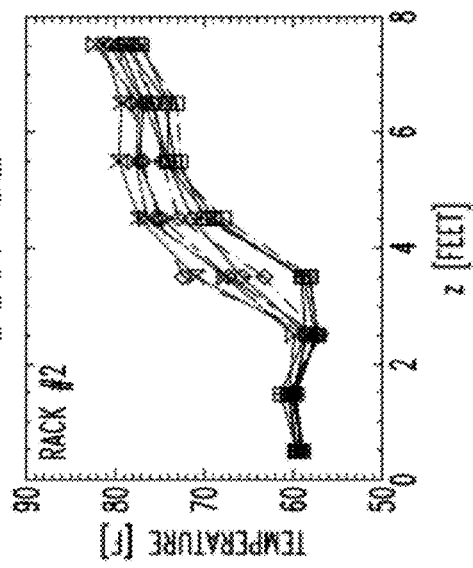
Figure 8C:
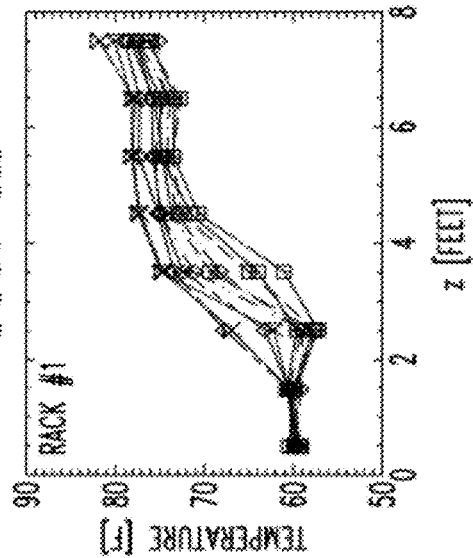
Figure 8D:
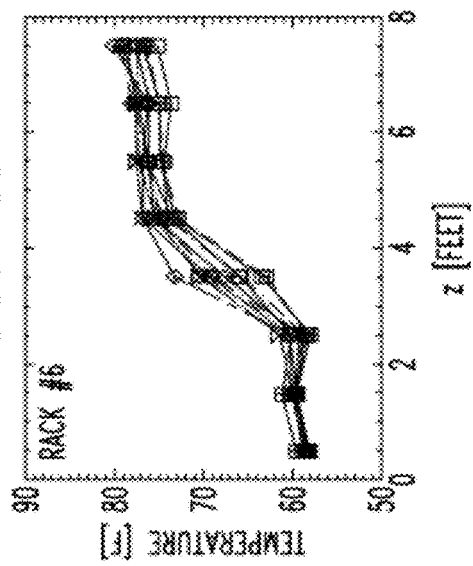
Figure 8E:
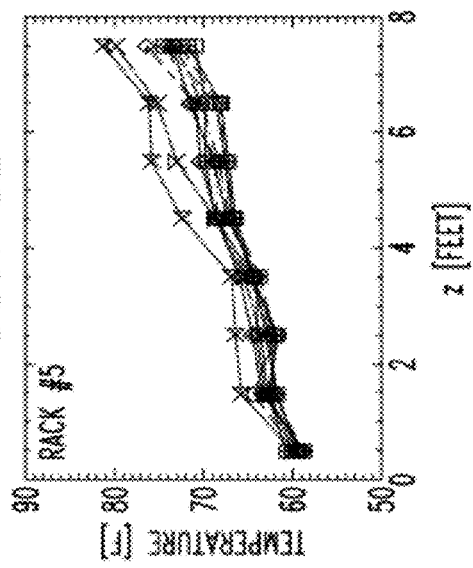
Figure 8F:
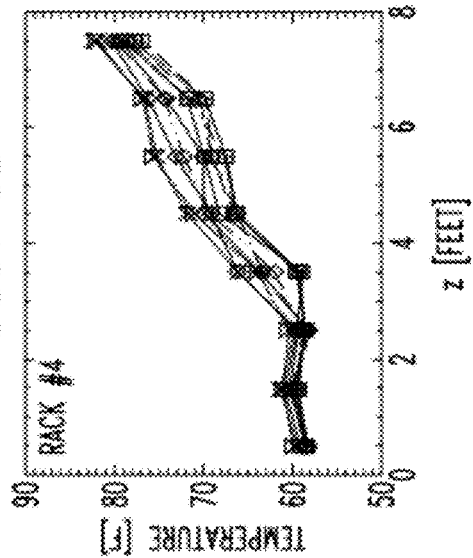
Figures 8G, 8H, 8I:
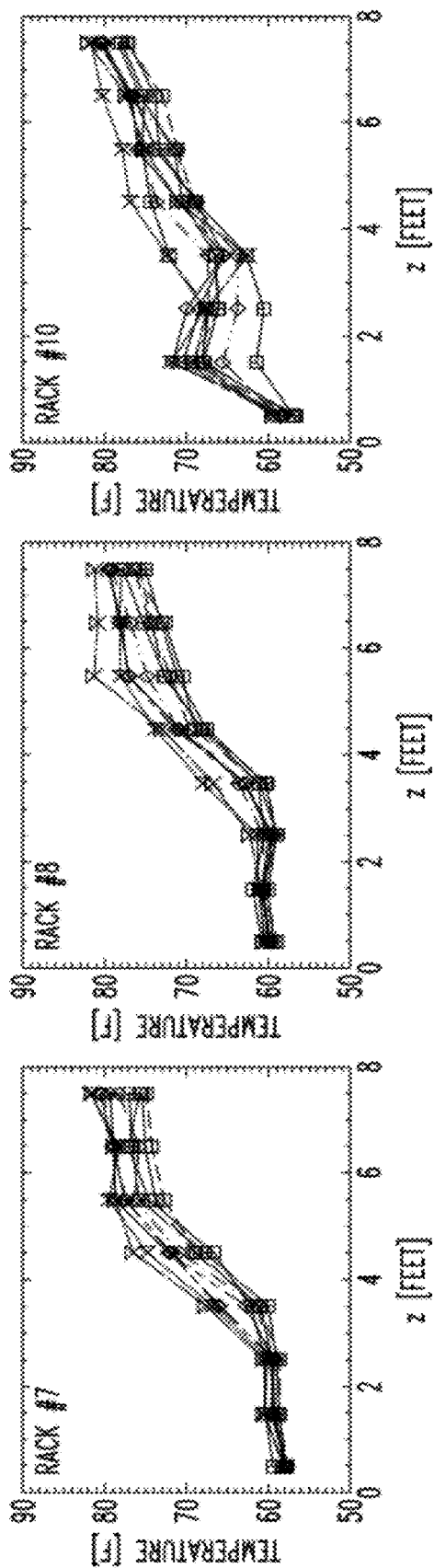
Figures 8J, 8K, 8L:
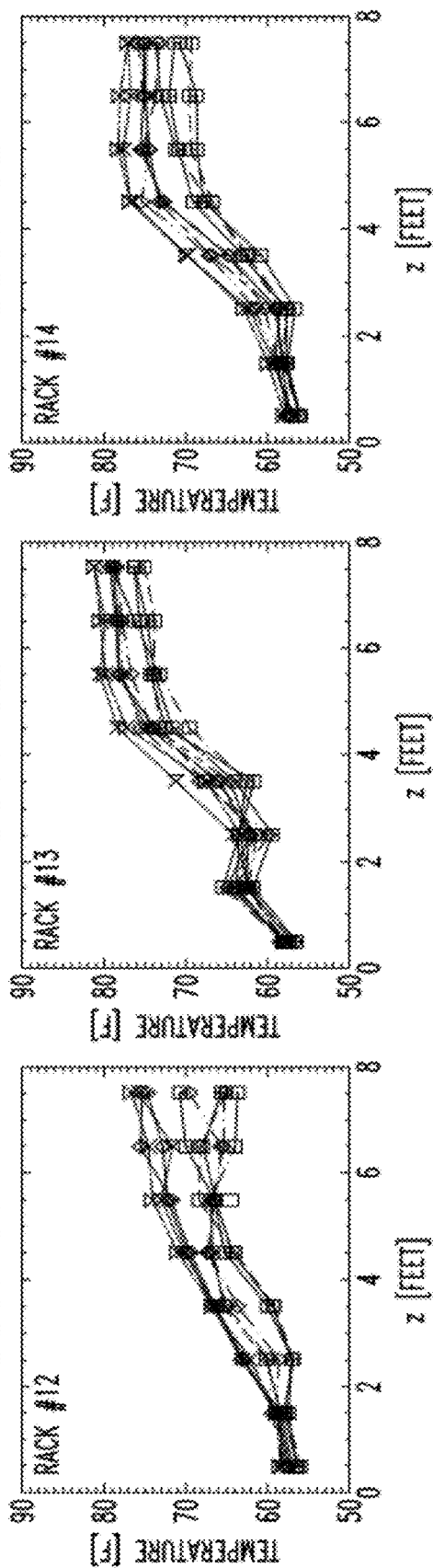

Additional evidence on how a physical condition can be related to the s-shape-ness is provided in FIGS. 8A-O. FIGS. 8A-O are graphs illustrating the vertical temperature distribution of 15 server racks in a small data center. Each graph corresponds to a particular server rack (i.e., FIG. 8A corresponds to rack #1, FIG. 8B corresponds to rack #2, and so on) in the data center with 10 different air flow settings (see below), a key 802 to which is presented below the graphs. In each graph, height of the rack z (measured in feet) is plotted on the x-axis and inlet temperature (measured in ° F.) is plotted on the y-axis. A layout 804 of the data center is also depicted below the graphs with the rack numbers in the layout corresponding to the rack numbers in the plots. Each plot has ten traces where the air flow in the data center was reduced from 12,400, 11,904, 11,408, 10,912, 10,416, 9,920, 9,424, 8,928, 8,432 and 8,060 cubic feet per minute (cfm) for cases 1 to 10, respectively. The data clearly show a shift of the s-curves towards smaller z-values as well as an increase in the upper plateau as the air flow in the data center is throttled down. A more careful analysis of the data in FIGS. 8A-O reveals that the lower plateau is constant while the upper plateau is increasing as the air flow is throttled down as described above.

Figure 9:
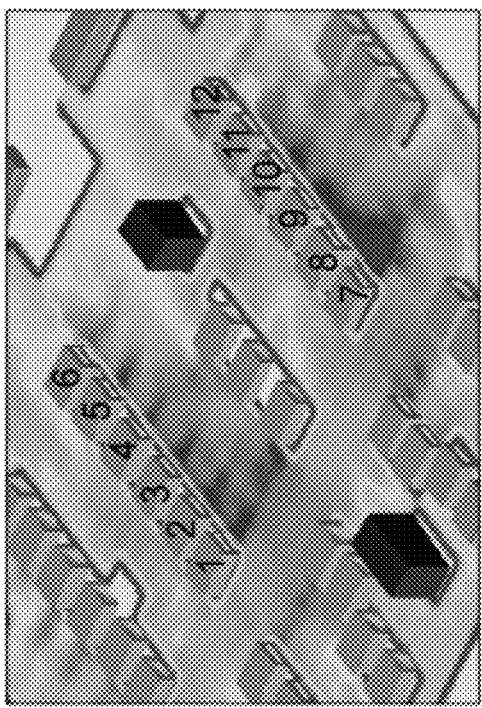
FIG. 9 is an exemplary table of results from applying the present s-curve representations to the inlet temperatures of the 12 server racks in the data center of FIG. 4 according to an embodiment of the present invention.

FIG. 9 is a table 900 of results from applying Equation 2, above, to the vertical inlet temperatures of the 12 server racks plotted for example in graph 500 of FIG. 5, and fitting the respective vertical temperature traces depicted, for example, in FIG. 5 to start creating a knowledge base. In table 900, as discussed above, the two racks (#7 and #12), which are the farthest away from the ACUs (supplying cold air) and quite exposed at the long aisle, show lower 50% points indicating strong recirculation. Rack #12 seems to be an exception with the lowest 50% point. Here the physics explanation is the relative low flow from the perforated tile (because it is too close to the ACU, which causes a Bernoulli (or negative pressure) effect).

Type Casting of S-Curves: As one example, in order to build the knowledge base, each vertical characterization is typecast. A vertical characterization is essentially the s-curve or relationship of height z to temperature at that height. Typecasting matches an actual s-curve to a predefined s-curve (a predefined s-curve might also be referred to herein as an "element" and constitutes, for example, an s-curve represented with a reduced set of parameters that is already in the knowledge base). According to an exemplary embodiment, the predefined s-curves are obtained using the MMT data, as described above. The data which is used to fit the vertical temperature profiles (thereby yielding the actual s-curves) can come from static MMT data and/or real-time MMT data.

Each typecast element possesses a number of attributes which relate to the physical world behaviors and probability of that behavior occurring. The attributes contribute to the probability that a behavior will occur since once one has the parameters describing the s-curves, and attributes such as air flow have been identified the dependence of these parameters on these attributes can actually be represented (using any kind of math relation). These attributes here might include rack location, distance of rack to ACUs, rack height, thermal footprint, rack exposure, ceiling height, distance to the nearest tile, air flow delivered to the server rack from the ACU, openings within the server rack, power consumption and air flow demand of the server rack. These are the attributes that influence an s-curve's shape. A method of deriving the s-curve (weighted network example FIGS. 10A-B, described below) is also provided.

Figure 10B:
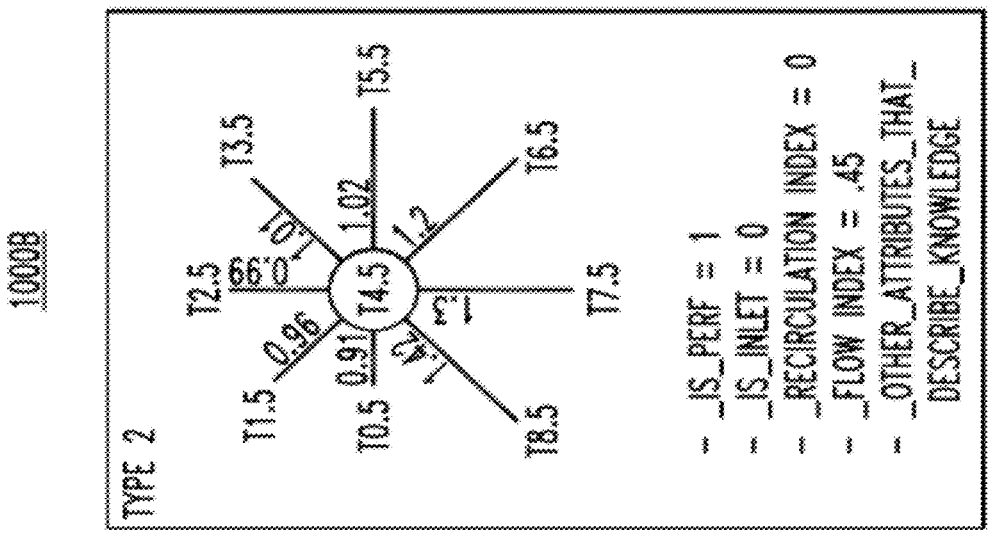
FIGS. 10A and 10B are diagrams illustrating an exemplary weighted network for typecasting predefined s-curve shapes according to an embodiment of the present invention.
Figure 10A:
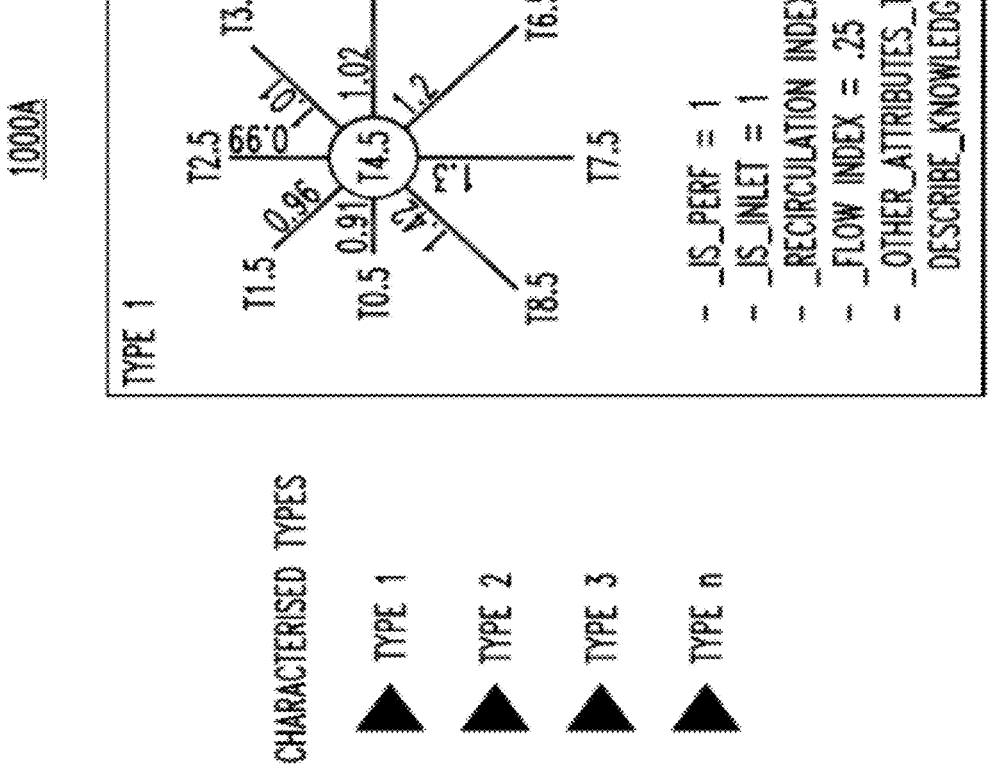

FIGS. 10A and 10B are diagrams 1000A and 1000B, respectively, illustrating an exemplary weighted network which provides a convenient way to typecast predefined s-curve shapes. In this weighted network example, the temperature T at z=4.5 is the control temperature and all other temperatures can be estimated from this. Each diagram is configured as a star with arms radiating out from T4.5, and the output is given as the sum of the weighted values. In diagrams 1000A and 1000B, for example, the number 1.02 linking T4.5 and T5.5 is the relation between the temperature at 4.5 feet and 5.5 feet. The length of the arms of the star indicate the correct ratio. In the star diagrams shown in FIGS. 10A and 10B, the center T4.5 is the entry point temperature (it could be at a different height however). As highlighted above, the arm length represents the ratio of the entry point temperature to the temperature at each of the other heights. So if T4.5 is 20° C., T7.5 is 1.3*20° C.=26° C. One example of its use would be if the temperature at a certain height is known, e.g., T0.5 (plenum temperature at perforated tile) and the predefined s-curve type is known, the temperature gradient for all heights can be reconstructed.

Figure 11:
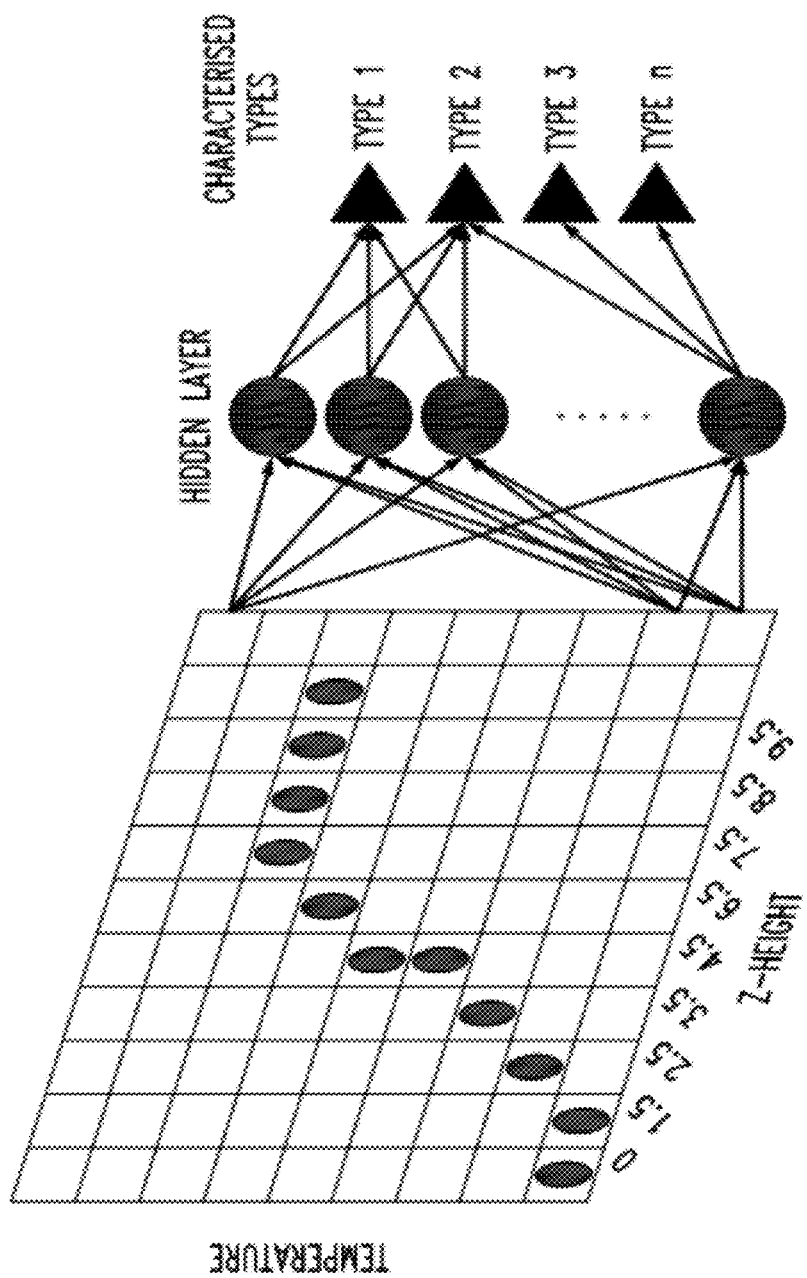
FIG. 11 is a diagram illustrating an exemplary neural network for typecasting predefined s-curve shapes according to an embodiment of the present invention.

The typecasting process can be made by characterizing the s-curve shape utilizing the reduced order representations described above, or by a neural network as depicted in FIG. 11, described below, to associate the s-curve shape (which is described by the parameters, see Equations 1 and 2, above) with its physical attributes (the s-curve shape is described by the parameters (see Equations 1 and 2). FIG. 11 is a diagram illustrating an exemplary neural network 1100 which provides another convenient way to typecast predefined s-curve shapes. Namely, FIG. 11 shows how a neural network may be implemented to cast actual temperature data (shown like a plot diagram) to a predefined s-curve (the output). Neural networks are good in mapping from inputs to outputs. Sometimes, in order to do this an intermediate or hidden layer is needed, which can be thought of as a different way to represent the same data. Neural networks are a fast way of traversing all the high density temperature data and casting it to a reduced number of predefined s-curve types.

As described above, n number of predefined s-curves are created based on what is known. The types can have attributes to describe them. For example, predefined s-curve TYPE 1
_is_perf=1
_is_Inlet=1
_RecirculationIndex=0
_FlowIndex=0.25
_attributes_that_describe_knowledge
predefined s-curve TYPE 2
_is_perf=0
_is_Inlet=1
_RecirculationIndex=0.5
_FlowIndex=0
_attributes_that_describe_knowledge Next, the s-curve types can be grouped in the knowledge base, as follows.

Grouping of S-Curve Types to behaviors: Reducing the variability of different s-curves by casting them to a simplified type using one of the reduced order methods, i.e., Equation 1, Equation 2 or neural network method, can allow grouping of the s-curve types. With different s-curve shapes typecast or characterized, it is possible to look at the arrangement of the different types of s-curves throughout the data center. These s-curve types are arranged by their x and y location parameters in the data center. Namely, what has been described before is the height of the inlet temperature z and the temperature at that height (an s-curve plot). Throughout the whole data center at different x,y coordinates (x and y are coordinates on the horizontal floor) there are these height to temp s-curves. Now groups of these s-curves are looked at together. So in each x,y coordinate on the floor, the actual temperature to height data is analyzed and cast to a predefined s-curve type. Essentially there is now an x,y grid of different pre-defined s-curves, e.g., type 1 to 20. Patterns or clusters of predefined s-curve types emerging from this grid are then found. The patterns they exhibit in their local neighborhood can be related to physical conditions in the data center.

By way of example only, the s-curves can be represented with a reduced order function (Equation 1 or Equation 2, above) and different ranges can then be used to group them. For example, in FIG. 9 (described above) s-curves with log (x0)<4 feet could be one group, or slopes from 10° C./feet to 20° C./feet and from 20° C./feet to 30° C./feet and from 30° C./feet to 40° C./feet could represent different groups. Combinations of these could be yet other groups. It is notable that the parameters in Equation 1 and Equation 2 can be used to cast actual temperature data to predefined s-curve types instead of using a neural network method.

Once the s-curves have been grouped, the location of a type can be found and it can be determined whether the occurrences of a certain type can be correlated with the location. Many examples have been given above regarding how the s-curve is influenced by recirculation, insufficient supply air, exposure (because the rack is at the edge of an aisle etc.).

Figure 12:
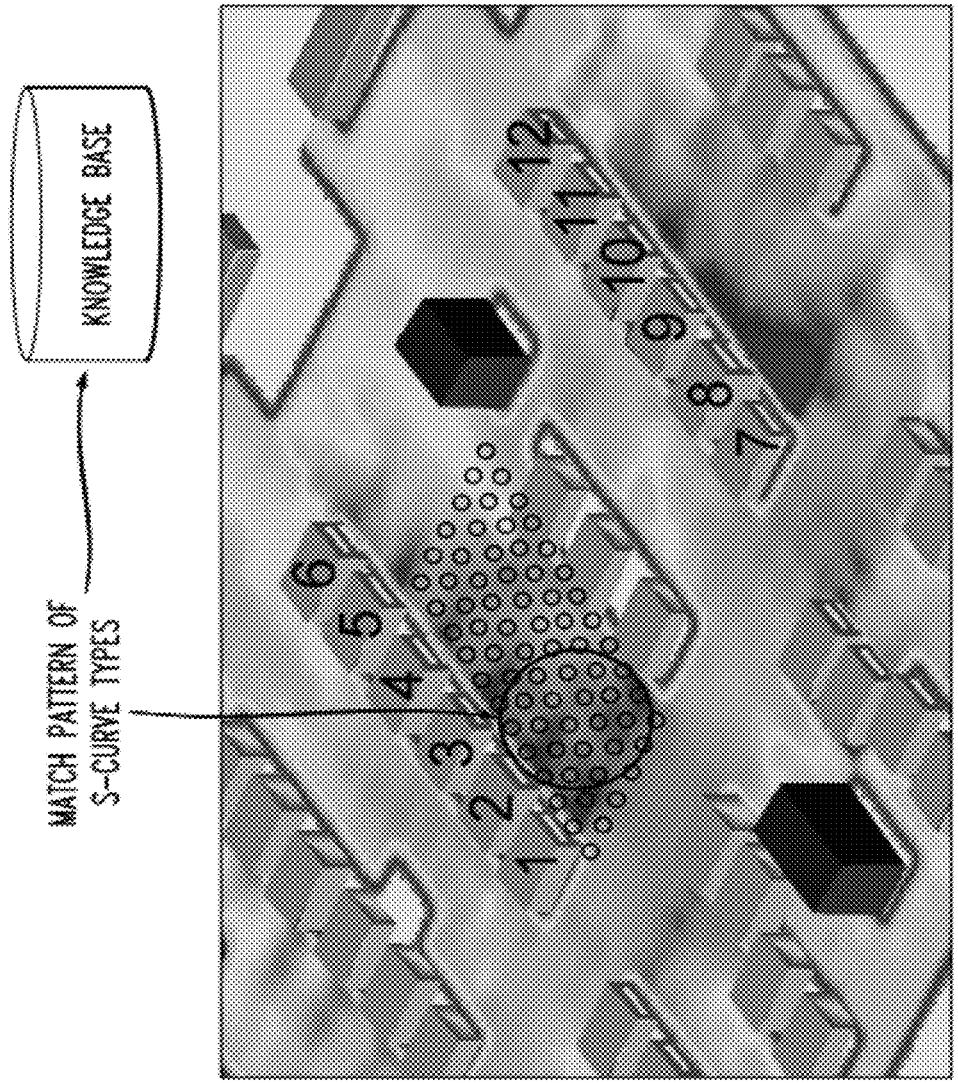
FIG. 12 is a diagram illustrating patterns being used to build a knowledge base according to an embodiment of the present invention.

FIG. 12 is a diagram illustrating emerging patterns being used to build a knowledge base. Now there is a knowledge base of real-life data which can be matched to patterns of s-curves. In a real-time data center, real-time sensors are placed and the data obtained therefrom is interpolated onto the high resolution MMT base data utilizing, for example, kriging interpolation techniques (described below). This generates new s-curves throughout the data center. These new s-curves are typecast to form a new horizontal grid of s-curve types which can be analyzed to yield recommendations or information from the knowledge base regarding the current data center environment.

Second knowledge bases can be built of these s-curve type patterns against the high level conditions they exhibit to explain the data center environment. As described above, certain types will occur under certain physical conditions such as insufficient air supply. For example, a less steep slope then the average curve and a low value for the 50% point may indicate insufficient air supply because hot air will be "sucked" from the ceiling.

FIG. 13 is a diagram illustrating how physical behaviors can be input, for example by a consultant (i.e., someone who can yield professional or expert advice) into the model. The circles show to where in the data center layout the physical behaviors are related. The model marks the pattern formed by the cluster of predefined s-curve types in the region enclosed by a circle to the behavior input by the consultant. Now that there is a horizontal array of characterised s-curve types, a new network can be created and taught based on MMT consultant experience. Information or knowledge associated with physical characteristics of the data center can be applied to patterns of s-curve types after each data center is surveyed. In FIG. 13, a typical MMT output is shown with recommendations. A supervised machine learning approach is used to link the patterns in the circles to the recommendations. Namely, the grid of predefined s-curve types as described above basically forms a pattern recognition problem, which can be solved by neural networks for example. The learning can be done by defining an area in the grid that a consultant can relate to a physical description (see above). So the patterns formed by clusters of predefined s-curve types can be recognized. The model is taught from consultant input. Once taught, the model can make predictions when it recognizes patterns or changes in patterns due to recasting invoked by kriging for example.

In one embodiment, the model can be taught utilizing supervised pattern recognition methodologies and machine learning techniques. Patterns within, for example a radius of n data points, can be taught based on real life experiences in different data centers and stored in the knowledge base. A weighted pattern recognition network can fuzzy match patterns to the knowledge base. As highlighted above, FIG. 13 depicts how this network may be taught by experience, wherein the circles represent the patterns of s-curve types which are linked to actual experiences in the data center. When the knowledge base is built, different combinations of patterns can be linked to physical behaviors to provide predictions and make recommendations and required action to be taken. Where patterns are unrecognizable, attributes of the typecast s-curves may be used to teach the model unsupervised. The attributes allow an understanding of individual s-curves and a compilation of this attributes may be correlated to physical behaviors.

Knowledge-based models and kriging: One application of the present knowledge-based model is its use for interpolations or kriging. See, for example, Noel A. C. Cressie "Statistics for Spatial Data," Chapter 3, A Wiley-Interscience publication, (1991), the contents of which are incorporated by reference herein. For example, in a data center, where a few (e.g., real-time) sensors are placed in front of the server racks, it might be desirable to estimate the inlet temperatures for servers, where no sensors are placed. Clearly, the combination of the knowledge base with the real-time values from the sensor may provide a very good estimate. A good mathematical framework for this interpolation comprises kriging. Kriging is an interpolation method predicting/estimating unknown values from measured data at known locations. Specifically, it uses variograms to obtain the spatial variation, and then minimizes the error of predicted values which are estimated by spatial distribution of the predicted values. Kriging can include trend functions, for example the s-curves as a function of x,y position as discussed above. The distinction about this kriging with knowledge-based model from the classical kriging model is that the knowledge-based model is explicitly respected (i.e., the knowledge-based model is incorporated and reflected in the kriging) in the model framework. The idea is, the temperature field is mainly governed by physics law, therefore if a reasonable model which reflects the physics law has been built, then it should be the building block of the temperature prediction model, what remains to be estimated is the deviation from this physics model. More specifically, assuming f(z) is a knowledge based model, for instance the s-curve function which describes the temperature variation as z-height. Let Y(r) be the observed temperature at location r=(x,y,z). Given the observed temperature at several spatial locations in the neighborhood of r, denote these locations as $r_i$ whose z-coordinates as $z_i$, then the prediction equation with the knowledge-based model consists of two components: f(z) and the kriging model taking as input of the neighboring locations' deviation from this knowledge based model: The coefficient of f(z) is included for the sake of model flexibility:

$$Y(r)=\beta f(z)+K(Y(r_i)-f(z_i)|i \in ne(r))$$

In practice, the choice of neighborhood ne(r) can be some heuristic criteria such as K-nearest neighbor or region of prescribed radius.

Figure 14:
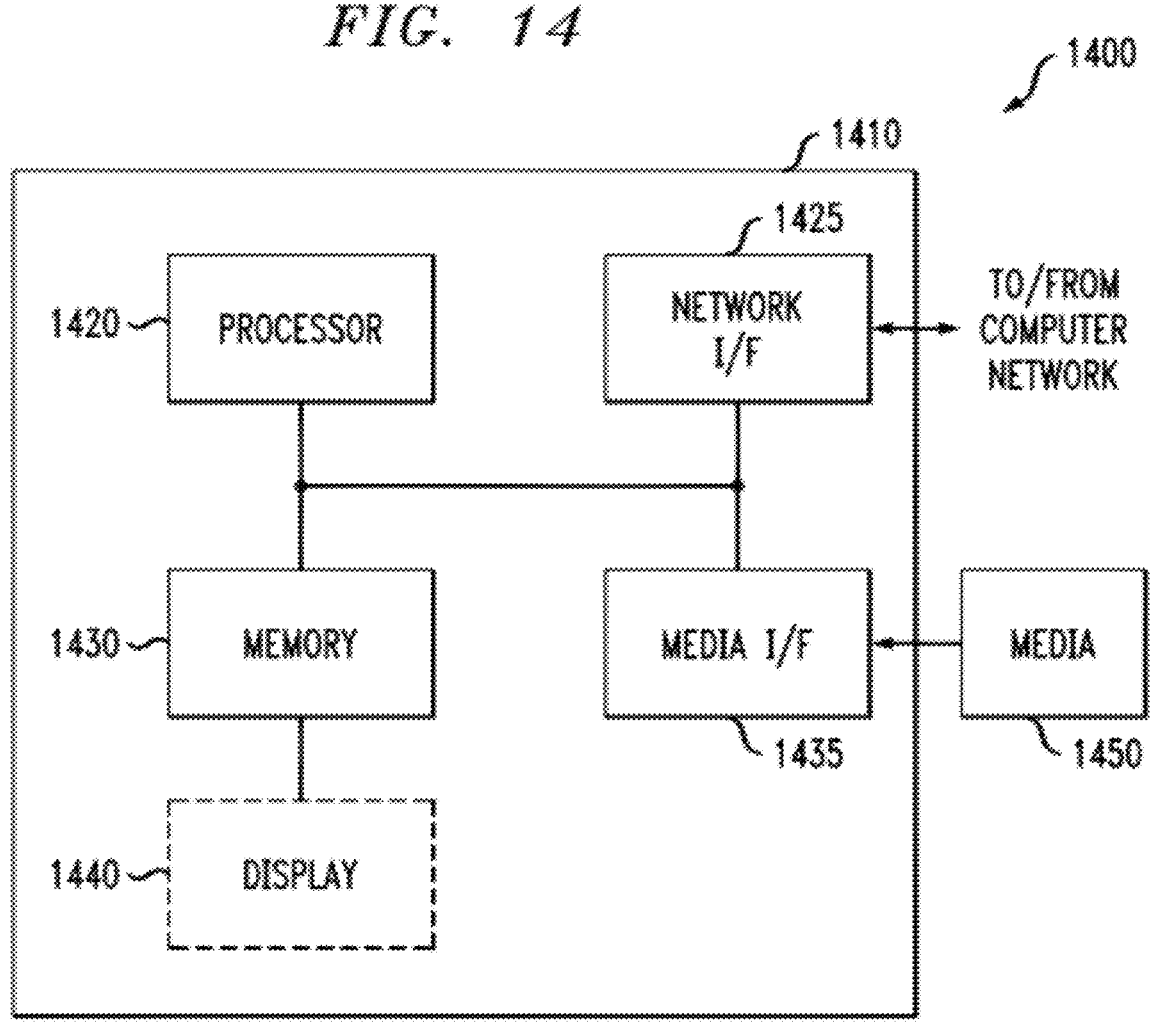
FIG. 14 is a diagram illustrating an exemplary apparatus for modeling thermal distributions in a data center according to an embodiment of the present invention.

Turning now to FIG. 14, a block diagram is shown of an apparatus 1400 for modeling thermal distributions in a data center, in accordance with one embodiment of the present invention. It should be understood that apparatus 1400 represents one embodiment for implementing methodology 200 of FIG. 2.

Apparatus 1400 comprises a computer system 1410 and removable media 1450. Computer system 1410 comprises a processor device 1420, a network interface 1425, a memory 1430, a media interface 1435 and an optional display 1440. Network interface 1425 allows computer system 1410 to connect to a network, while media interface 1435 allows computer system 1410 to interact with media, such as a hard drive or removable media 1450.

As is known in the art, the methods and apparatus discussed herein may be distributed as an article of manufacture that itself comprises a machine-readable medium containing one or more programs which when executed implement embodiments of the present invention. For instance, the machine-readable medium may contain a program configured to obtain vertical temperature distribution data for a plurality of locations throughout the data center; plot the vertical temperature distribution data for each of the locations as an s-curve, wherein the vertical temperature distribution data reflects physical conditions at each of the locations which is reflected in a shape of the s-curve; and represent each of the s-curves with a set of parameters that characterize the shape of the s-curve, wherein the s-curve representations make up a knowledge base model of predefined s-curve types from which thermal distributions and associated physical conditions at the plurality of locations throughout the data center can be analyzed.

The machine-readable medium may be a recordable medium (e.g., floppy disks, hard drive, optical disks such as removable media 1450, or memory cards) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used.

Processor device 1420 can be configured to implement the methods, steps, and functions disclosed herein. The memory 1430 could be distributed or local and the processor 1420 could be distributed or singular. The memory 1430 could be implemented as an electrical, magnetic or optical memory, or any combination of these or other types of storage devices. Moreover, the term "memory" should be construed broadly enough to encompass any information able to be read from, or written to, an address in the addressable space accessed by processor device 1420. With this definition, information on a network, accessible through network interface 1425, is still within memory 1430 because the processor device 1420 can retrieve the information from the network. It should be noted that each distributed processor that makes up processor device 1420 generally contains its own addressable memory space. It should also be noted that some or all of computer system 1410 can be incorporated into an application-specific or general use integrated circuit.

Optional video display 1440 is any type of video display suitable for interacting with a human user of apparatus 1400. Generally, video display 1440 is a computer monitor or other similar video display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for modeling thermal distributions in a data center, comprising the steps of:
    obtaining vertical temperature distribution data for a plurality of locations throughout the data center;
    plotting the vertical temperature distribution data for each of the locations as an s-curve, wherein the vertical temperature distribution data reflects physical conditions at each of the locations which is reflected in a shape of the s-curve; and
    representing each of the s-curves with a set of parameters that characterize the shape of the s-curve, wherein the s-curve representations make up a knowledge base model of predefined s-curve types from which thermal distributions and associated physical conditions at the plurality of locations throughout the data center is analyzed.

2. The method of claim 1, wherein the temperature distribution data is obtained using mobile measurement technology (MMT).

3. The method of claim 1, wherein the parameters include one or more of a lower plateau of the s-curve, an upper plateau of the s-curve, s-shape-ness in an upper part of the s-curve, s-shape-ness in a lower part the s-curve and height at which a half point of the s-curve is reached.

4. The method of claim 1, wherein the set of parameters further includes one or more parameters describing a particular location in the data center for which the s-curve is a plot of the vertical temperature distribution data.

5. The method of claim 1, wherein the data center comprises server racks and a raised-floor cooling system with one or more computer air conditioning units configured to take in hot air from the server racks and to exhaust cooled air into a sub-floor plenum that is delivered to the server racks through a plurality of perforated tiles in the raised floor.

6. The method of claim 5, further comprising the step of:
obtaining the vertical temperature distribution data at an air inlet side of each of one or more of the server racks in the data center.

7. The method of claim 5, wherein the physical conditions comprise one or more of server rack locations in the data center, distance of a server rack to air conditioning units, server rack height, thermal footprint, server rack exposure, ceiling height, distance to nearest tile, air flow delivered to the server rack from the air conditioning units, openings within the server rack, power consumption of the server rack and air flow demand of the server rack.

8. The method of claim 1, wherein the vertical temperature distribution data is obtained for a time T=0, the method further comprising the steps of:
obtaining real-time temperature data for a time T=1, wherein the real-time data is less spatially dense than the data obtained for time T=0; and
interpolating the real-time data onto the data obtained for time T=0 to obtain updated vertical temperature distribution data for the plurality of locations.

9. The method of claim 8, further comprising the steps of:
plotting the updated vertical temperature distribution data for each of the locations as an updated s-curve, wherein the updated vertical temperature distribution data reflects updated physical conditions at each of the locations which is reflected in a shape of the updated s-curve; and
mating the updated s-curve to the predefined s-curve types in the knowledge base model.

10. The method of claim 1, further comprising the step of:
grouping the predefined s-curve types based on similar parameters.

11. An article of manufacture for modeling thermal distributions in a data center, comprising a machine-readable recordable medium containing computer executable instructions which when executed by a computer implement the steps of the method according to claim 1.

12. An apparatus for modeling thermal distributions in a data center, the apparatus comprising:
a memory; and
at least one processor device, coupled to the memory, operative to:
obtain vertical temperature distribution data for a plurality of locations throughout the data center;
plot the vertical temperature distribution data for each of the locations as an s-curve, wherein the vertical temperature distribution data reflects physical conditions at each of the locations which is reflected in a shape of the s-curve; and
represent each of the s-curves with a set of parameters that characterize the shape of the s-curve, wherein the s-curve representations make up a knowledge base model of predefined s-curve types from which thermal distributions and associated physical conditions at the plurality of locations throughout the data center is analyzed.

13. The apparatus of claim 12, wherein the data center comprises server racks and a raised-floor cooling system with one or more computer air conditioning units configured to take in hot air from the server racks and to exhaust cooled air into a sub-floor plenum that is delivered to the server racks through a plurality of perforated tiles in the raised floor.

14. The apparatus of claim 13, wherein the at least one processor device is further operative to:
obtain the vertical temperature distribution data at an air inlet side of each of one or more of the server racks in the data center.

15. The apparatus of claim 12, wherein the vertical temperature distribution data is obtained for a time T=0, and wherein the at least one processor device is further operative to:
obtain real-time temperature data for a time T=1, wherein the real-time data is less spatially dense than the data obtained for time T=0; and
interpolate the real-time data onto the data obtained for time T=0 to obtain updated vertical temperature distribution data for the plurality of locations.

16. The apparatus of claim 15, wherein the at least one processor device is further operative to:
plot the updated vertical temperature distribution data for each of the locations as an updated s-curve, wherein the updated vertical temperature distribution data reflects updated physical conditions at each of the locations which is reflected in a shape of the updated s-curve; and
mate the updated s-curve to the predefined s-curve types in the knowledge base model.

17. The apparatus of claim 12, wherein the at least one processor device is further operative to:
group the predefined s-curve types based on similar parameters.

* * * * *